US010813236B1

(12) United States Patent
Degner et al.

(10) Patent No.: US 10,813,236 B1
(45) Date of Patent: Oct. 20, 2020

(54) COMPUTER TOWER ARCHITECTURE

(71) Applicant: Apple Inc., Cupertino, CA (US)

(72) Inventors: Brett W. Degner, Menlo Park, CA (US); Michael E. Leclerc, Sunnyvale, CA (US); Danny L. McBroom, Leander, TX (US); Houtan R. Farahani, San Ramon, CA (US); Michael D. McBroom, Leander, TX (US); Bart K. Andre, Palo Alto, CA (US); Sabrina K. Paseman, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/692,570

(22) Filed: Nov. 22, 2019

Related U.S. Application Data

(63) Continuation of application No. 16/586,779, filed on Sep. 27, 2019, now Pat. No. 10,645,832.

(60) Provisional application No. 62/842,378, filed on May 2, 2019.

(51) Int. Cl.
| | |
|---|---|
| *H05K 5/03* | (2006.01) |
| *H05K 5/02* | (2006.01) |
| *G06F 1/20* | (2006.01) |
| *G06F 1/18* | (2006.01) |
| *H05K 5/04* | (2006.01) |
| *H05K 7/20* | (2006.01) |

(52) U.S. Cl.
CPC ............... *H05K 5/03* (2013.01); *G06F 1/181* (2013.01); *G06F 1/188* (2013.01); *G06F 1/20* (2013.01); *H05K 5/023* (2013.01); *H05K 5/0213* (2013.01); *H05K 5/0221* (2013.01); *H05K 5/0247* (2013.01); *H05K 5/04* (2013.01); *H05K 7/20145* (2013.01)

(58) Field of Classification Search
CPC .. G06F 1/16; G06F 1/181; H05K 7/18; H05K 7/14; A47B 31/02
USPC ..................... 361/679.6; 312/223.2
See application file for complete search history.

(56) References Cited

U.S. PATENT DOCUMENTS

| 3,493,725 A * | 2/1970 | Mackay ................ A47J 39/025 219/385 |
| 5,564,930 A * | 10/1996 | Yu ........................... G06F 1/181 361/679.41 |
| 5,638,957 A | 6/1997 | Brasier |

(Continued)

FOREIGN PATENT DOCUMENTS

| CN | 1983114 B | 3/2013 |
| CN | 104679163 A | 6/2015 |

*Primary Examiner* — Zachary Pape
(74) *Attorney, Agent, or Firm* — Dorsey & Whitney LLP

(57) ABSTRACT

A housing for an electronic device can include an enclosure at least partially defining an internal volume. The enclosure can include a bottom panel. The housing can also include a tubular frame that includes a first pair of tubular support members extending from the bottom panel and a second pair of tubular support members extending from the bottom panel. The housing can also include a first tubular top frame member disposed outside the internal volume and connected to an end of each of the first pair of tubular support members through an opening defined by the enclosure, and a second tubular top frame member disposed outside the internal volume and connected to an end of each of the second pair of tubular support members through an opening defined by the enclosure.

20 Claims, 15 Drawing Sheets

(56) References Cited

U.S. PATENT DOCUMENTS

| | | | |
|---|---|---|---|
| 5,793,608 A | | 8/1998 | Winick et al. |
| 6,141,213 A | | 10/2000 | Antonuccio et al. |
| 6,166,910 A | * | 12/2000 | Ronberg ............. E05B 73/0082 |
| | | | 248/551 |
| 6,168,249 B1 | * | 1/2001 | Chien ................... A47B 47/03 |
| | | | 312/223.2 |
| 6,504,718 B2 | | 1/2003 | Wu |
| 6,525,935 B2 | | 2/2003 | Casebolt |
| 6,618,248 B1 | | 9/2003 | Dalheimer |
| 6,801,430 B1 | | 10/2004 | Pokharna |
| 7,078,619 B2 | * | 7/2006 | Chamberlain ........... G01V 1/16 |
| | | | 174/37 |
| 8,253,015 B2 | | 8/2012 | Chang |
| 8,416,567 B2 | | 4/2013 | Cheng |
| 8,657,312 B2 | * | 2/2014 | Guasta ................... B62B 3/005 |
| | | | 280/37 |
| 9,250,662 B2 | | 2/2016 | Tang |
| 10,104,795 B2 | * | 10/2018 | Liebert ................... H05K 5/03 |
| 10,459,498 B1 | | 10/2019 | Kinstle et al. |
| 2002/0074911 A1 | | 6/2002 | Chen et al. |
| 2006/0104025 A1 | | 5/2006 | Wabiszczewicz |
| 2009/0038783 A1 | | 2/2009 | Chen |
| 2009/0284109 A1 | | 11/2009 | Lee |
| 2013/0265713 A1 | | 10/2013 | Crane et al. |
| 2015/0129568 A1 | * | 5/2015 | Miller ................ B23K 37/0294 |
| | | | 219/137.2 |
| 2018/0188785 A1 | | 7/2018 | Han |
| 2018/0299930 A1 | * | 10/2018 | Wu ........................ G06F 1/181 |

\* cited by examiner

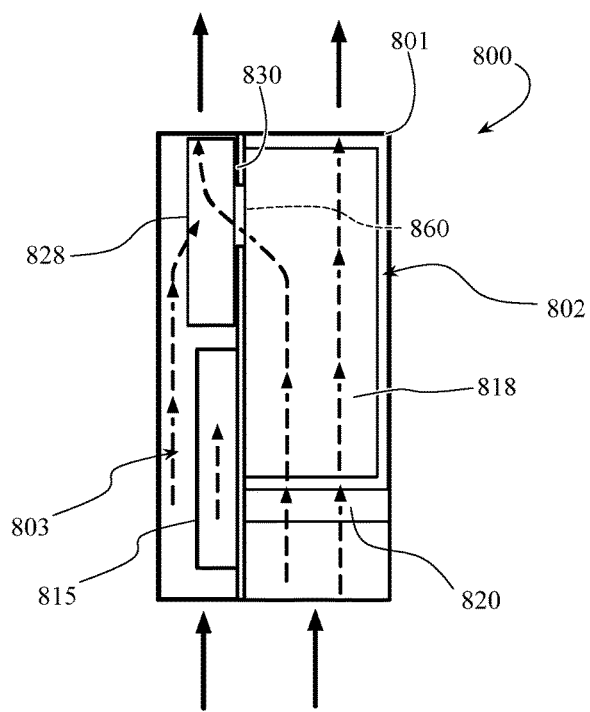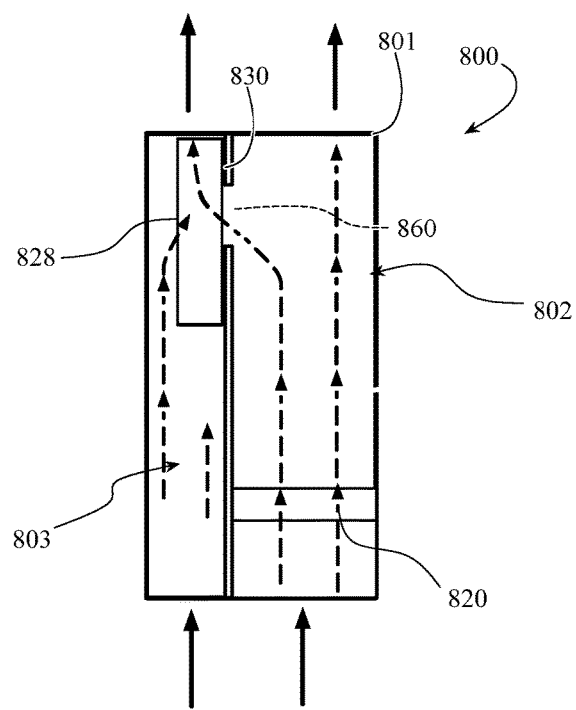
*FIG. 22A*     *FIG. 22B*

COMPUTER TOWER ARCHITECTURE

CROSS-REFERENCE TO RELATED APPLICATION(S)

The present application is a continuation of U.S. patent application Ser. No. 16/586,779, filed 27 Sep. 2019, and entitled "COMPUTER TOWER ARCHITECTURE," which claims priority to U.S. Provisional Patent Application No. 62/842,378, filed 2 May 2019, and entitled "COMPUTER TOWER ARCHITECTURE," the contents of which are incorporated herein by reference in their entireties for all purposes.

FIELD

The described embodiments relate generally to enclosures. More particularly, the present embodiments relate to enclosures for electronic devices.

BACKGROUND

The components of an electronic device, for example a processor of the electronic device, can generate heat during routine use. The performance of these components, as well as the overall performance of the electronic device itself, can depend on the operating temperature of the various components. Accordingly, it can be desirable to remove or redistribute the thermal energy generated by the components of an electronic device, in order to maintain a desirable operating temperature and to ensure a desirable level of device performance.

Continued advances in electronic devices and their components have enabled considerable increases in performance. Existing components and structures for electronic devices can, however, limit the levels of performance of such devices. For example, an existing electronic device housing can limit the performance of an electronic device due to an inability to distribute effectively or remove heat generated by the components of the electronic device to the surrounding environment. Further, some solutions for distributing or removing heat generated by an electronic device can be undesirably noisy, bulky, complicated to manufacture, or have other undesirable properties. Consequently, further tailoring an arrangement of components for electronic devices to provide additional or enhanced functionality, without introducing or increasing undesirable device properties, can be desirable.

SUMMARY

An exemplary electronic device includes a housing defining an internal volume. A component is disposed within the internal volume, dividing the internal volume into a first volume and a second volume. The component includes an aperture providing fluid communication between the first volume and the second volume. A seal is disposed on the component, the seal substantially fluidically isolating the first volume from the second volume, except at the aperture. The electronic device can further include an air-moving system to produce a positive air pressure in the first volume and a negative air pressure in the second volume.

The air-moving system of the exemplary electronic device can further include a first air-moving apparatus that produces the positive air pressure in the first volume by moving air into the first volume from an ambient environment, and a second air-moving apparatus that produces the negative air pressure in the second volume by moving air into the ambient environment from the second volume. The air-moving system moves air between the first volume and the second volume through the aperture.

The first air-moving apparatus can include at least one fan disposed in the first volume, and the second air-moving apparatus can include a blower disposed in the second volume. In one example, the first air-moving apparatus includes a first fan, a second fan disposed above the first fan, and a third fan disposed above the second fan, wherein the first fan, the second fan, and the third fan cooperate to extend substantially along an entire height of the housing.

The electronic device can include a main logic board. The main logic board can include a first surface and a second surface positioned opposite the first surface, wherein a first electronic component is disposed on the first surface and a second electronic component is disposed on the second surface. In one example, the main logic board includes a number of ports or interconnects.

In one example, a second component can be disposed within the first volume and positioned at the aperture of the first component. The second component can include a power supply unit. In one example, the first volume and the second volume occupy substantially all of the internal volume.

An exemplary housing for an electronic device can include a frame configured to receive and support one or more electronic components, and can include one or more tubular support members extending from a floor panel, the floor panel defining at least a portion of an exterior surface of the housing, and a port panel including one or more ports. The port panel can be coupled to and disposed normal to the floor panel and can define at least a portion of the exterior surface of the housing. The housing can further include a shell defining an internal volume, sized to encompass the one or more electronic components and configured to couple with the frame and engage the floor panel and the port panel to define the exterior surface of the housing. The shell can be integrally removable from the frame and include a first panel at least partially defining the exterior surface of the housing and defining a plurality of apertures extending therethrough, and a second panel disposed opposite the first panel and at least partially defining the exterior surface of the housing. The second panel can define a plurality of apertures extending therethrough and can further define a slot sized to substantially surround and engage a periphery of the port panel.

The shell can further include a first mesh coupled to a surface of the first panel at least partially defining the internal volume, and a second mesh component coupled to a surface of the second panel at least partially defining the internal volume. The shell can further include a top panel at least partially defining the exterior surface of the housing and defining an aperture sized to allow a portion of the frame to extend therethrough when the shell is coupled to the frame. The portion of the frame can include a handle. The handle can include a first end coupled to a first tubular support member of the frame and a second end coupled to a second tubular support member of the frame. The frame can further include one or more feet extending from the floor panel and configured to physically support the housing. The shell can be coupled to the frame by a locking mechanism having a locked state and an unlocked state, the locked state retaining the shell on the frame and the unlocked state allowing the shell to be integrally removed from the frame, wherein the locking mechanism is movable between the locked state and the unlocked state by a user.

Yet another exemplary electronic device includes a housing defining an internal volume, a computing component positioned within the internal volume, the computing component dividing the internal volume into a first zone and a second zone, the component further defining an aperture providing fluid communication between the first zone and the second zone. The housing and the computing component can define an airflow pathway from an ambient environment into the first zone, from the first zone through the aperture in the computing component to the second zone, and from the second zone to the ambient environment, and an air-moving system moves air through the airflow pathway, wherein the air moving system establishes a positive air pressure in the first zone and a negative air pressure in the second zone.

An exemplary electronic device can further include a seal at least partially surrounding the computing component and cooperating with the housing to fluidically isolate the first zone from the second zone, except at the aperture.

In another exemplary electronic device, the air-moving system includes a fan in the first zone, and a blower in the second zone.

BRIEF DESCRIPTION OF THE DRAWINGS

The disclosure will be readily understood by the following detailed description in conjunction with the accompanying drawings, wherein like reference numerals designate like structural elements, and in which:

FIGS. 22A and 22B illustrate a top schematic view of the electronic device of FIG. 20 including arrows illustrating airflow.

DETAILED DESCRIPTION

Figure 1:
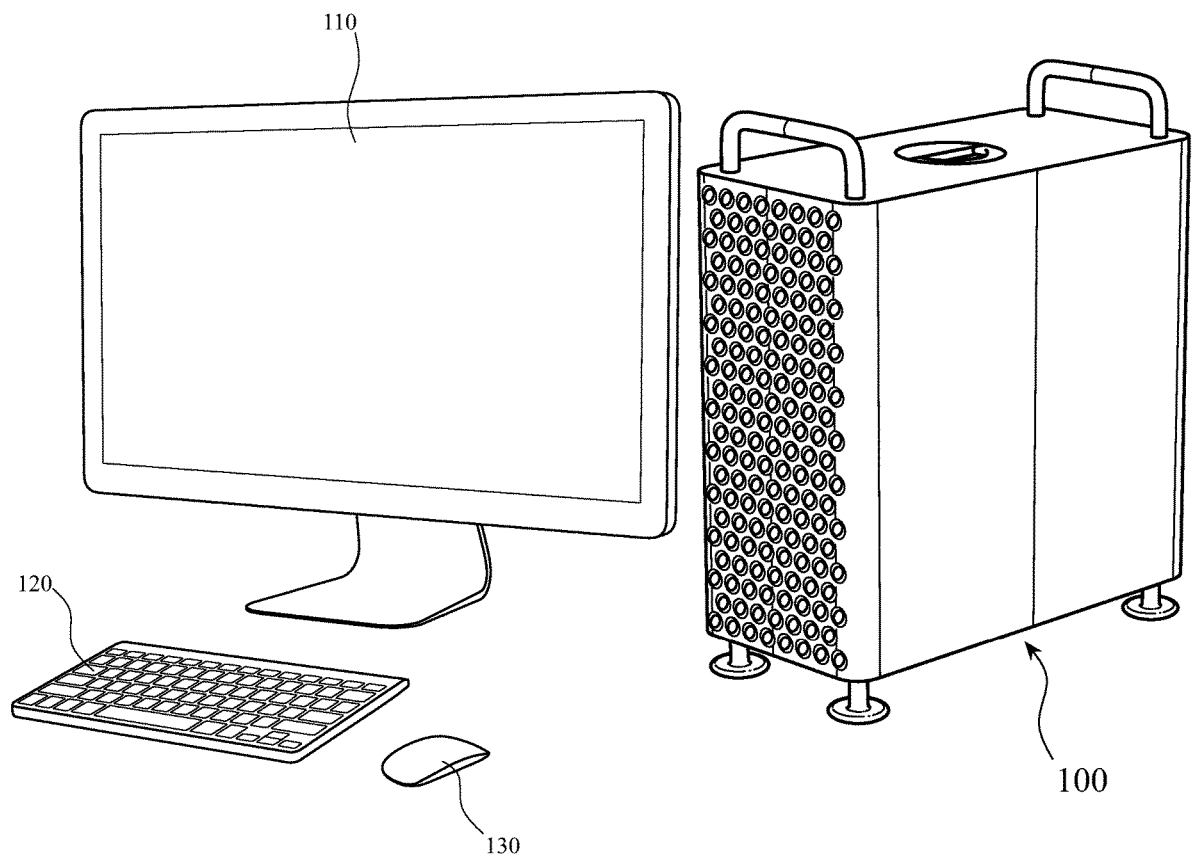
FIG. 1 illustrates a perspective system view of a computing system including an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components, as appropriate. For instance, methods described can be performed in an order different from that described, and various steps can be added, omitted, or combined. Also, features described with respect to some embodiments can be combined in other embodiments.

One aspect of the present disclosure relates to an electronic device including a housing that defines an internal volume. The electronic device can include computing components within the internal volume, such as processors, circuit boards, memory, power supply units, and/or drives. A computing component positioned within the internal volume, such as a logic board, can divide the internal volume into a first volume and a second volume. In some examples, the first volume and the second volume can occupy substantially all of the internal volume. The component can substantially fluidically isolate the first and second volumes, except at one or more apertures defined by the component, through which the volumes can fluidically communicate. The electronic device can also include a first air-moving apparatus, for example one or more fans, that produces a positive pressure in the first volume and a second air-moving apparatus, for example a blower, that produces a negative pressure in the second volume.

Accordingly, the components of an electronic device can have an arrangement and cooperate such that airflow pathways into, through, and out of the electronic device provide for a desirable amount of heat distribution and removal, while maintaining a compact and efficient spatial arrangement and without producing undesirably high levels of noise. In contrast, traditional components for electronic devices, such as housings and circuit boards, as well as traditional arrangements of these components, can produce airflow pathways that do not promote the efficient redistribution or removal of heat from the device. Typically, multiple fans are housed within an electronic device to move relatively cool air from the ambient environment into the device, where the air can be heated by the components of the device and then expelled back into the ambient environment, away from the device.

The components and their arrangement within an internal volume of a typical electronic device can create airflow dead spots within the internal volume. That is, there can be locations in the internal volume where the airflow is insufficient to adequately remove heat from the device. These dead spots can be caused by the spatial arrangement of the components within the electronic device, or by canceling interference between airflow from competing fans. Accordingly, these dead spots can demand additional or more powerful fans to be incorporated into the device to achieve a desired level of performance. The use of additional or more powerful fans can, however, increase the noise produced by the electronic device, or can require more space with which to house the fans, thereby undesirably increasing the overall size of the electronic device. Another way in which airflow and heat removal is traditionally enhanced in an electronic device is by providing more space within the internal volume for air to flow amongst the components that require cooling. However, adding space in the internal volume to allow airflow can also undesirably increase the overall volume of the electronic device.

Accordingly, it is desirable to design and arrange the components of an electronic device to produce airflow pathways that can effectively remove or redistribute heat in the electronic device without the need for a significant increase in the internal volume of the electronic device or for a high powered and noisy air-moving system, for example by including an undesirably large number of fans.

Users of electronic devices, such as desktop computers, often seek to replace one or more of the internal components of the computer. For example, if advances in technology result in the production of a more powerful graphics processing unit (GPU), a user may seek to replace the existing GPU within their electronic device with the more powerful GPU. As such, it can be desirable for the components of the electronic device to be easily accessible and replaceable by a user or technician. Thus, in addition to the desirable airflow and heat removal features described herein, the arrangement and design of the components of an electronic device, such as the housing, can also provide users with access to one or more components of the electronic device.

Traditional desktop computers typically provide access to the internal components on only one side of the device. Accordingly, traditional components are arranged within the desktop computer so that they are accessible and removable from a single side of the device. Such an arrangement, however, may not be compatible with a space efficient component arrangement that produces a desirable amount of airflow through or within the electronic device. This tension between accessibility and thermal management can again lead to dead spots and the need for a larger housing or an undesirably large number of fans, thereby increasing the device size or resulting in a device that produces a high level of noise during operation.

In some examples, the components and processes for forming and assembling the components described herein can be used to provide electronic devices that utilize multiple isolated volumes or zones which can cooperate to produce a desired level of thermal management without requiring extremely powerful or large air-moving systems, while still providing access to the components for a user or a technician of the electronic device.

Further, the components of the electronic device can be formed and arranged to allow for a high configurability, modularity, and accessibility, while minimizing the overall volume and size of the electronic device. In some examples, the multiple zones of the electronic device can be isolated by a seal but can communicate at select locations to efficiently control and direct airflow provided by an air-moving system. For example, one zone can have a positive air pressure with respect to the ambient environment while another zone can have a negative air pressure with respect to the ambient environment. The pressure in each zone can be controlled by the air-moving system to provide for airflow into, out of, and between the zones, to achieve a desirable level of thermal management for the components of the electronic device.

FIG. 1 shows a computing system including an electronic device 100. The electronic device 100 shown in FIG. 1 is a computer, for example a desktop computer, and can be connected to a display or monitor 110. This is, however, merely one representative example of a device that can be used in conjunction with the ideas disclosed herein. The electronic device 100 can, for example, correspond to a portable media player, a media storage device, a portable digital assistant ("PDA"), a tablet computer, a display, a mobile communication device, a GPS unit, a remove control device, and similar electronic devices. The electronic device 100 can be referred to as an electronic device or a consumer device. As shown, the electronic device 100 can also be connected to any number of input devices such as a keyboard 120, a mouse 130, a track pad, a stylus, a microphone, or any combination of known input devices. Further detail of the electronic device 100 is illustrated in FIG. 2.

Figure 2:
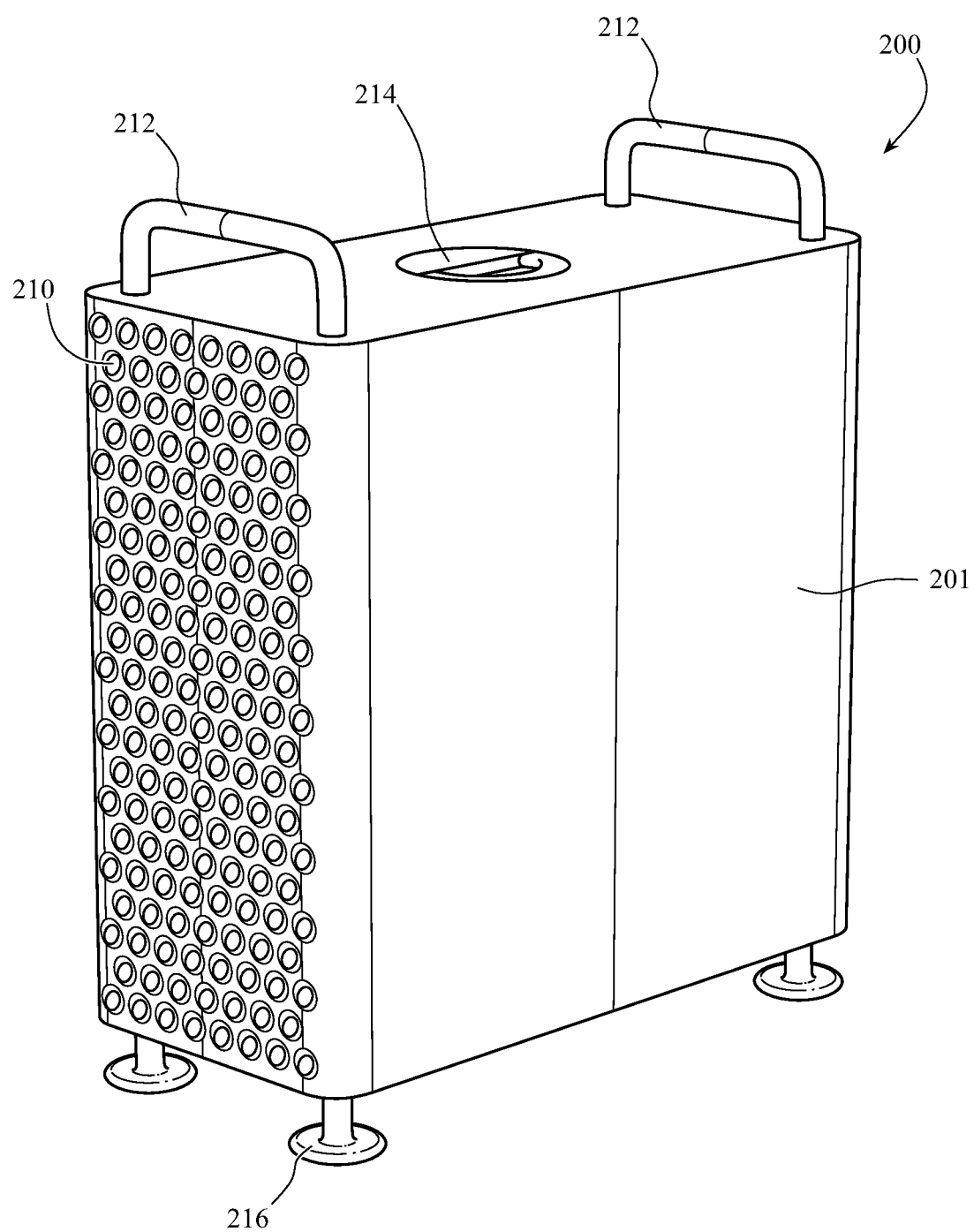
FIG. 2 illustrates a front perspective view of an electronic device.

FIG. 2 illustrates an electronic device 200, for example, as used in the computing system shown in FIG. 1. The electronic device 200 can be connected to a display and one or more input devices. The electronic device 200 is configured for placement upon, underneath, or adjacent to a work surface, such as a table or a desk. In some examples, the electronic device 200 of the computing system can be referred to as a desktop computer. The electronic device 200 can include multiple internal electronic components including at least a central processing unit (CPU), in some examples located on one or more logic boards, such as a main logic board, one or more graphics processing unit (GPU) boards, and other primary and secondary internal components. The electronic device 200 can also include a housing 201 that can define an internal volume of the electronic device 200 and can at least partially define an external surface of the electronic device 200. Although the housing 201 of electronic device 200 is illustrated as having an approximately rectangular shape, in some examples the electronic device 200 and housing 201 can assume substantially any shape, as desired. In some embodiments, the electronic device can also be coupled to other electronic devices to form a multi-computer system that can be used, for example, as a server computer system (such as in a data farm) or as a network computing system having each electronic device 200 as a node (or nodes).

In some examples, the electronic device 200 can include a housing 201 that can define an internal volume within which the internal components of the electronic device are disposed. The housing 201 can be easily removed for user access or servicing. The housing 201 can include a metallic material, such as aluminum. In some examples, the housing 201 can have an anodized aluminum oxide layer that both protects the housing 201 and promotes heat transfer for cooling the internal volume. In some examples where the housing 201 includes a metal such as aluminum, the electrical conductivity of the housing 201 can provide a ground for internal electrical components arranged to fit and operate within the housing 201. The housing 201 can also provide an electromagnetic interference (EMI) shield to protect sensitive electronic components from external electromagnetic energy as well as reducing an amount of electromagnetic energy emanating from internal components within the electronic device from penetrating the housing 201, thereby providing a desired level of electromagnetic compatibility (EMC).

The housing 201 can include a mechanism 214, such as a mechanical latch, which can be used to couple the housing 201 of the electronic device 200 securely to internal structures of the electronic device 200, as described further herein. The mechanism 214 can take the form of a twisting latch or other such operable mechanism that can be manually engaged and disengaged, for example, by a user or technician. In this way, the housing 201 can be easily removed in order to expose internal components and structures of the electronic device 200 for user maintenance, upgrade, or servicing by a technician. In some examples, a detection circuit (not shown) of the electronic device 200 can be used to detect whether the housing 201 is properly situated in place with respect to internal components and structures. The detection circuit can serve a useful function as the thermal management strategy of electronic device 200 can rely on the proper placement and use of the housing 201 in combination with the arrangement of internal components and an air-moving system within the internal volume define by the housing 201.

In some examples, the detection circuit can determine that the housing 201 is not in proper placement or alignment with respect to internal structures or components of the electronic device 200, and the detection circuit can prevent the electronic device 200 from operating, or at least from operating at full capacity. In some examples, the detection circuit can include a magnetic sensor (such as a Hall Effect device) located to detect one or more magnets disposed on the housing 201 when the external housing 201 is properly placed and aligned on the electronic device 200. The housing 201 can also include one or more features, such as handles 212, that can allow for a user or technician to handle or transport the electronic device 200.

The housing 201 can further include one or more support features 216, for example in the form of feet. The support features 216 can serve to provide a physical support for the electronic device 200 when it is resting on a surface and can further prevent a large surface of the housing 201 from directly contacting the surface on which it is positioned. In this way, the support features 216 can provide a space between the housing 201 and the surface in order to allow air to flow therethrough and thereby assist in the thermal management for the electronic device 200.

A number of apertures, holes, perforations, or passageways 210 can be formed in a front surface of the housing 201 that can provide fluid communication between the ambient environment and the internal volume defined by the housing 201. The apertures 210 can be substantially any shape, but in some examples, can be circular or spherical as described herein. In some examples, the apertures 210 can allow for direct fluid communication between the ambient environment and the internal volume. In some examples, however, the apertures 210 can allow for fluid communication between the ambient environment and the internal volume through one or more components, such as an air-moving apparatus or system, as described herein.

In some examples, the apertures or holes 210 can be in the form of a three-dimensional structure that can include spherical recesses that interfere or intersect with each other to create through holes 210 arranged in specified patterns. The spherical recesses can have a base form of three spherical recesses in a common plane that at least partially intersect or interfere with one another, and a fourth spherical recess on an adjacent plane that intersects or interferes with each of the three spherical recesses to create a network of interconnected through holes 210. This base form can be propagated or repeated throughout the structure to form the aggregate three-dimensional structure. For example, in some examples where the housing 201 includes such a three-dimensional structure, the structure can maximize both surface area and aperture 210 distribution for thermal transfer, while maintaining a robust structural lattice. That is, a housing 201 including the interconnected through holes 210 can optimize its ability to distribute or remove heat from the electronic device 200, while remaining both light and strong, thereby improving performance of the electronic device 200 compared to traditional monolithic or closed contiguous structures. Additional views of the electronic device are detailed below with reference to FIG. 3.

Figure 3:
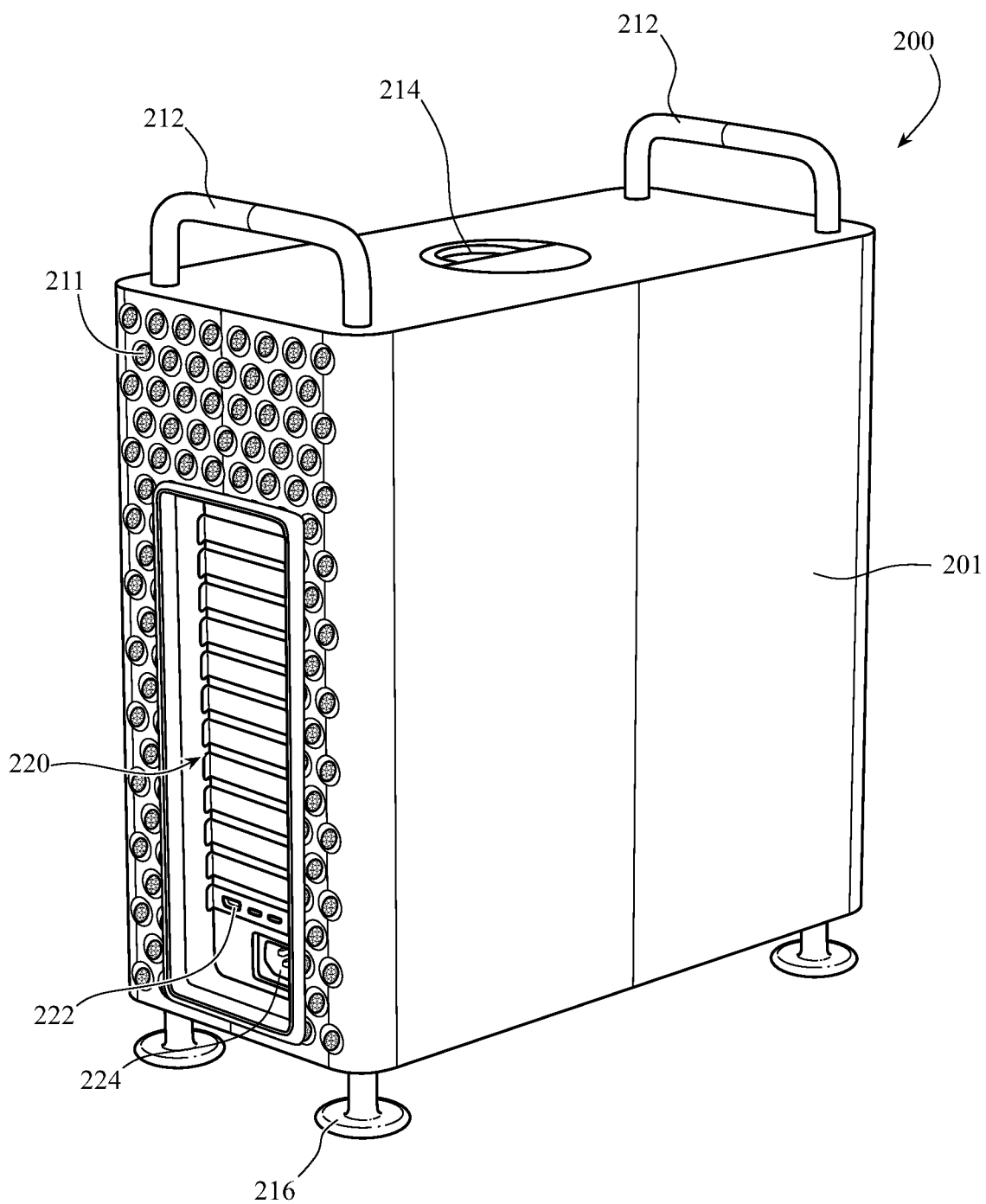
FIG. 3 illustrates a rear perspective view of the electronic device of FIG. 2.

As shown in FIG. 3, in some examples, the housing 201 of the electronic device 200 can include an interface panel 220, for example, located on a rear surface of the housing 201. The interface panel 220 can include various ports 222 that can be used to communicate data and/or power between the electronic device 200 and various external systems. For example, the interface panel 220 can include a set of audio ports that can be used to provide an audio stream to an external audio system, such as headphones, speakers, or an audio processor. The set of audio ports can also be used to receive an audio stream from an external audio system, such as a microphone or audio recording device. The interface panel 220 can also include one or more ports, including one or more bus ports, one or more high-speed expansion ports, one or more networking ports, and one or more video ports. The data ports can be used to transfer data and/or power between one or more external circuits and the electronic device 200. The data ports can be used to accommodate a broad range of data connections according to different wired data communication protocols, for example, one or more Universal Serial Bus (USB) ports, one or more Thunderbolt high speed expansion ports, one or more Ethernet networking ports, one or more high definition media interface (HDMI) ports, and other data ports.

The electronic device 200 can be interconnected to other computing systems through one or more of the data ports provided on the interface panel 220, e.g., to data storage devices, portable media players, and/or video equipment, to form a network of computing systems. Accordingly, the interface panel 220 and associated data ports of the electronic device 200 can be used to form connections from the electronic device 200 to a large number and variety of external computing systems and circuits, which can prove particularly useful when a large amount of computing resources is desired. Moreover, the size and shape of the electronic device 200 can lend itself to space efficient computing networks or data farms, in some representative embodiments and uses.

The interface panel 220 can also include a video port that can be used to communicate high-speed video between the electronic device 200 and an external video monitor or other external video processing circuitry, for example, as shown in FIG. 1. The interface panel 220 can include an alternating current (AC) power input port 224, which can be sized and shaped to accept a power plug suitable for transferring external power to operational electronic components within the housing 201, for example, through a power supply unit as described herein. In some examples, the electronic device 200 can include internal power resources (such as a battery) that can be charged and re-charged in accordance with power delivered by way of power input port 224.

The housing 201 can also include a power switch (not shown) that can be readily available to accept a user touch to initiate a power on sequence (including, for example, a boot up process) as well as a power down sequence. In some embodiments, the power switch can be illuminated and provide an activity indication to a user, e.g., under software control of a processing unit in the electronic device 200.

The housing 201 can also include or define a number of apertures, holes, perforations, or passageways 211, for example formed in a rear surface of the housing 201. The holes 211 can be substantially similar to the holes 210 described with respect to FIG. 2 and can provide fluid communication between the ambient environment and the internal volume defined by the housing 201. The apertures 211 can be substantially any shape, but in some examples, can be circular or spherical, as described herein. In some examples, the apertures 211 can allow for direct fluid communication between the ambient environment and the internal volume. In some examples, however, the apertures 211 can allow for fluid communication between the ambient environment and the internal volume through one or more components, such as an air-moving apparatus or system, as described herein.

Any number or variety of components, as described herein, can be included in the electronic device. The components can include any combination of the features described herein and can be arranged in any of the various configurations described herein. The structure and arrangement of an electronic device including a housing defining an internal volume divided into one or more zones by a component or components within the internal volume, as well as the concepts regarding zone pressures and airflow can apply not only to the specific examples discussed herein, but to any number of embodiments in any combination. Various embodiments of electronic devices including components having various features in various arrangements are described below, with reference to FIGS. 4-6.

Figure 4:
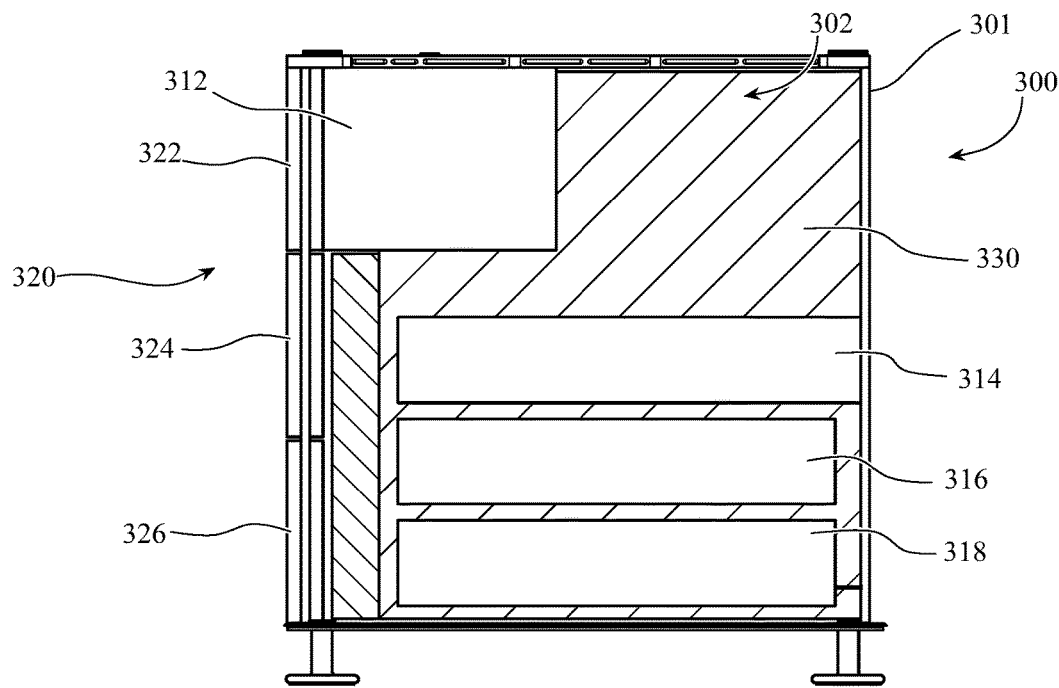
FIG. 4 illustrates a cross-sectional schematic view of an electronic device.

FIG. 4 illustrates a schematic cross-sectional view of an electronic device 300 taken along one side, for example the right side of the electronic device 300. The electronic device 300 is merely one representative example of a device that can be used in conjunction with the systems and concepts disclosed herein. The electronic device 300 can be, for example, a desktop computer and can be substantially similar to and can include any of the features of the electronic devices 100, 200 described herein.

As with electronic device 200, the electronic device 300 can include a housing 301 that defines an internal volume of the electronic device 300 and that can at least partially define an exterior surface of the electronic device 300. The internal volume defined by the housing 301 can include the components of the electronic device 300 therein. In some examples, and as described below with respect to FIGS. 5 and 6, the internal volume defined by the housing 301 can be divided into one or more zones, regions, or volumes by one or more of the components of the device 300. These zones or volumes can also be referred to as thermal zones or pressure zones. In the present example, a logic board, such as a main logic board 330 can divide and separate the internal volume into a first zone 302 and a second zone 303.

In this example, the main logic board 330 is sized and positioned within the internal volume defined by the housing 301 such that the main logic board 330 extends substantially an entire height and width of the internal volume, thereby dividing the internal volume into a first zone 302 located on one side of the main logic board 330 and a second zone 303 located on the other, opposite side of the main logic board 330. In FIG. 4, the first zone 302 is shown, while the second zone 303 is positioned behind the main logic board 330 within the internal volume.

A number of electronic, electrical, and other components of the electronic device 300 can be disposed within the first zone 302 defined by the housing 301 and the main logic board 330. In this example, the first zone 302 can include one or more central processing units (CPUs), such as CPU 312, one or more graphics processing units (GPUs) such as GPUs 314 and 316, a power supply unit 318, a first air-moving apparatus 320, as well as other components that are not shown. In some examples, one or more of the components can be electrically connected to the main logic board 330, for example, directly by soldering or by interfacing with one or more ports on the main logic board 330.

In some examples, the first zone 302 can positioned and configured such that any components therein can be easily accessed by a user or technician when the housing 301 is removed from the electronic device 300, as described herein. For example, as shown in FIG. 4, an entire height and width of the first zone 302 can be exposed when the housing 301 is removed from the electronic device 300, allowing any of the components positioned therein to be adjusted, removed, or otherwise accessed by a user or a technician. In some examples, the GPUs 314, 316 can be removably connected to the main logic board 330, for example, by one or more ports in the main logic board 330. The configuration of these components and the first zone 302 are such that the GPUs 314, 316 can be easily removed and replaced by the user, as desired, without the need to remove or replace the other components of the electronic device 300.

Accordingly, the architecture of the electronic device 300 and the housing 301 enable a highly modular and configurable design with respect to the components of the electronic device 300. One or more of the components can be selectively replaced by, for example, more powerful or alternative components without the need to disturb the other components of the electronic device 300. Further, because such a large amount of the internal volume is exposed when the housing 301 is removed from the electronic device 300, a user or a technician can easily and directly remove and replace the components, thereby allowing the electronic device 300 to be highly modular and adaptable to a particular user's needs, as desired.

The electronic device 300 can also include an air-moving system to move air from the ambient environment into the housing 301 of the electronic device 300; to move air in the internal volume defined by the housing 301, for example between the first zone 302 and the second zone 303; and to move air from the internal volume defined by the housing 301 out to the ambient environment. As described herein, the air-moving system can control the air pressure of the zones of the internal volume relative to the ambient environment, for example producing positive or negative air pressure in a specific zone, as desired. In some examples, the air-moving system can include a first air-moving apparatus 320 that can be positioned entirely within the first zone 302, although in some other examples one or more components of the first air-moving apparatus 320 can be positioned exterior to the first zone 302 or the internal volume defined by the housing 301.

The air-moving apparatus 320 can be designed to optimize the balance between fan sound level and air volume distributed through the first zone 302. According to one example, three air moving components, such as fans, can be incorporated adjacent to the first zone 302 to create a positive pressure in the first zine 302, relative to the ambient environment. However, any number of fans or fan designs can be used to achieve the desired fan sound level and air volume distribution.

As shown, the first air-moving apparatus 320 can include one or more air-moving components, such as fans, that can cooperate to move air, as described herein. In some examples, any suitable component capable of moving air or producing airflow can be included in the first air-moving apparatus 320. In the present example, the air-moving system 320 can move air from the ambient environment into the first zone 302 through, for example, holes in the housing 301, to create a positive air pressure in the first zone 302 relative to the ambient environment. The first air-moving apparatus 320 can include a first fan 322, a second fan 324, and a third fan 326. Although described herein as including three fans, the first air-moving apparatus 320 can include any number or type of air-moving components, as desired. In some examples, each of the fans 322, 324, 326 can be the same size, although in other examples, the fans can be different sizes and can have variable sizes relative to one another, as desired. The first air-moving apparatus 320 can extend substantially an entire height of the first volume 302, for example as shown, effectively moving a wall of air into the first zone 302. In some examples, the speed of each fan 322, 324, 326 can be independently controlled, for example, by a processor of the electronic device 300 to create a desired location and amount of airflow into the first volume 302. The second zone or volume 303 is detailed below with reference to FIG. 5.

Figure 5:
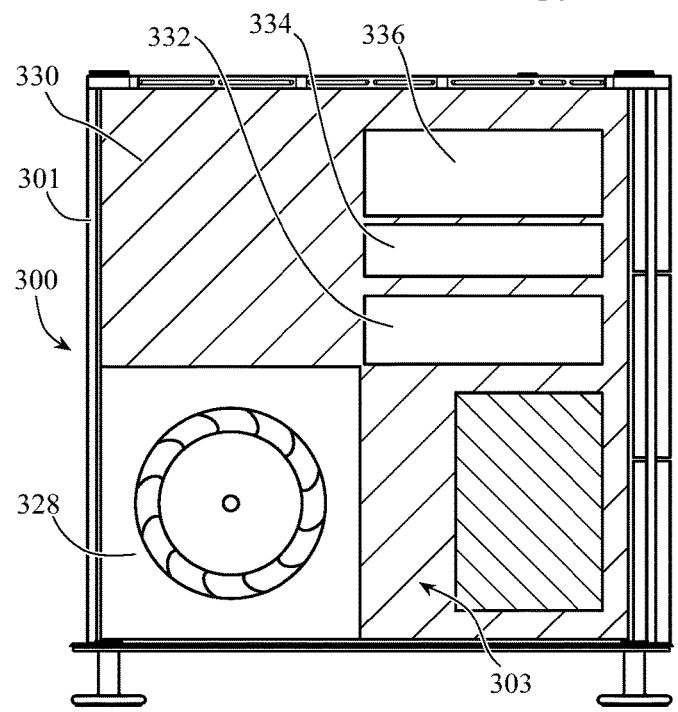
FIG. 5 illustrates a cross-sectional schematic view of the electronic device of FIG. 4.

FIG. 5 illustrates a schematic cross-sectional view of the opposite side of the electronic device 300 from that of FIG. 4, and shows the second zone 303 of the internal volume, as defined by the housing 301 and the main logic board 330. In some examples, the electronic device 300 can include one or more memory modules 332, 334, 336, such as, dual inline memory modules (DIMMs), that can be constructed from a substrate on which are mounted multiple memory chips. The memory modules 332, 334, 336 can be positioned and electrically connected to the main logic board 330. Importantly, while certain components of the electronic device 300 can be positioned on and be connected to a first surface of the main logic board 330, such that they are within the first zone 302, other components such as the memory modules 332, 334, 336 can be disposed on and be connected to a second surface of the main logic board 330, such that they are disposed in the second zone 303. As discussed herein, the inclusion of the components of the electronic device 300 in multiple zones, as well as the configuration of the components in the zones, can allow the air-moving system of the electronic device 300 to provide a desired level of airflow to each component.

The air-moving system of the electronic device 300 can further include a second air-moving apparatus 328, for example, positioned within the second zone 303. As with the first air-moving apparatus 320, the second air-moving apparatus 328 can be positioned entirely within the second zone 303, although in some other examples, one or more components of the second air-moving apparatus 328 can be positioned exterior to the second zone 303 or the internal volume defined by the housing 301. In the present example, the second air-moving apparatus 328 can include a blower 328 to move air from the second zone 303 to the ambient environment through the housing 301, for example, through holes formed in the housing 301. In this way, the second air-moving apparatus 328 can produce a negative air pressure in the second zone relative to the ambient environment. Although the second air-moving apparatus 328 is a blower in the present example, in some examples, substantially any component capable of moving air or producing airflow can be included in the second air-moving apparatus 328. Details of the main logic board 330 separating the internal volume of the electronic device 300 into a first and a second zone are provided below with reference to FIG. 6.

Figure 6:
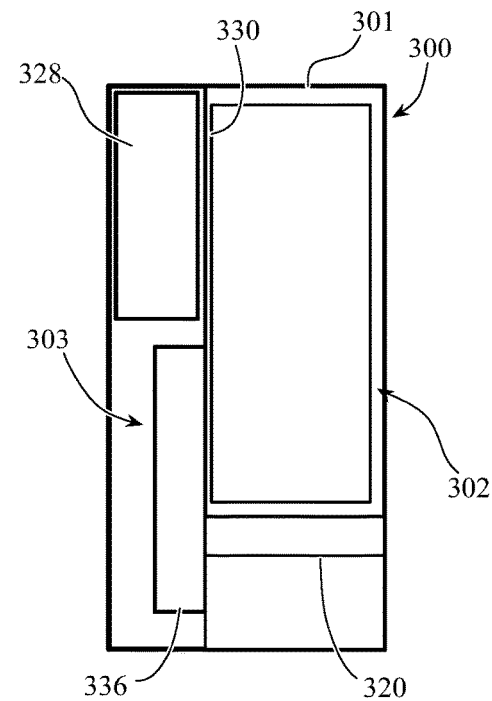
FIG. 6 illustrates a schematic top view of the electronic device of FIG. 4.

FIG. 6 shows a schematic view of the top of the electronic device 300, including the housing 301 that defines an internal volume thereof. As can be seen, a component such as the main logic board 330 can divide and separate the internal volume into at least a first zone 302 and a second zone 303. The electronic device 300 can also include an air-moving system that can include a first air-moving apparatus 320 and a second air-moving apparatus 328 that can function to create a positive pressure zone and a negative pressure zone, as described herein. Although the present electronic device 300 includes a component, in this example main logic board 330, that has a relatively planar geometry, other component geometries are expressly contemplated and can be used to divide the internal volume into any number or configuration of zones, as desired. Further, in some examples, multiple components can cooperate to divide the internal volume into two or more zones, as desired.

Importantly, as described herein, the dividing component, such as the main logic board 330, can include electrical components that are disposed in each of the zones of the internal volume. Whereas traditional electronic device architectures include substantially all of the components in a single zone, the use of multiple zones allows for the selective control of airflow and pressure in each zone to provide a desired level of thermal management, while simultaneously allowing a user or technician access to the modular components on either side of the electronic device 300. Additional embodiments of electronic devices including components having various features in various arrangements are described below, with reference to FIGS. 7-11.

Figure 7:
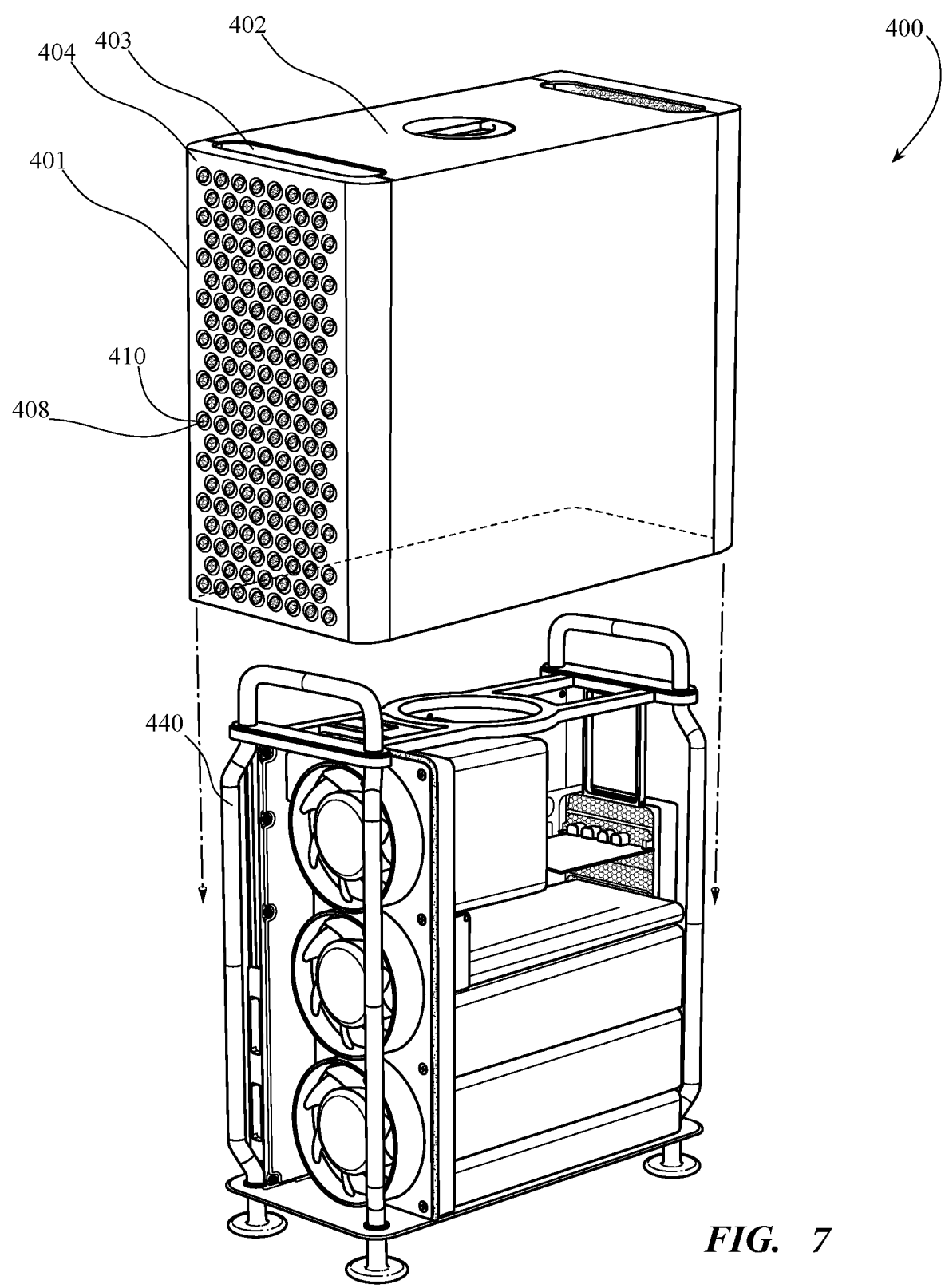
FIG. 7 illustrates a perspective view of components of an electronic device.

FIG. 7 illustrates a perspective view of an electronic device 400 including a shell component 401 separated from a frame or chassis component 440. The electronic device 400 can be, for example, a desktop computer and can be substantially similar to, and include any of the features of the electronic devices 100, 200, and 300 described herein. The housing of electronic device 400 can be substantially similar to the housings 201, 301, described herein, that can define an internal volume and an exterior surface of the electronic device 400.

As can be seen in FIG. 7, the housing can include a shell 401 that can define an internal volume sized to encompass portions of the frame 440 and the electronic components received and supported by the frame 440, as described herein. The shell 401 can couple with the frame 440 to define the exterior surface of the housing. In some examples, shown in FIG. 7, the shell 401 can be integrally removed from the frame 440, for example, by a user. In some examples, the shell 401 can be coupled to the frame 440 by a locking mechanism that can have a locked state and an unlocked state. In the locked state, the shell 401 is retained on the frame 440, for example, as illustrated in FIG. 2. In the unlocked state, the shell 401 can be selectively removed from the frame, as desired, by lifting or sliding the shell 401 off of the frame 440.

The shell 401 can include a top panel 402 that can at least partially define the exterior surface of the housing, for example, the top surface thereof. In some examples, the top panel 402 can include or define one or more apertures 403 that can allow a portion of the frame 440 to extend therethrough. For example, the frame 440 can include a handle or handles 409 that can pass through the apertures 403 of the top panel 402 and can be exposed to the exterior environment. The shell 401 can further include a number of panels that are coupled to or otherwise affixed to the top panel 402.

The panels can extend from the top panel 402. For example, the panels can extend from and be normal to the top panel 402. The shell 401 can include a first panel or a front panel 404 that can be substantially an entire height of the electronic device 400. In some examples, the front panel 404 can define a number of apertures, holes, perforations, or passageways 410 that extend therethrough and that can provide fluid communication between the ambient environment and the internal volume defined by the shell 401. In some examples, the apertures 410 can be substantially similar to apertures 210 described herein.

In some examples, the shell 401 can further include a mesh or a perforated component 408 that can be coupled to, or be disposed substantially adjacent to, the surface of the front panel 404 that at least partially defines the internal volume. In some examples, the mesh can substantially cover the apertures 410 such that any fluid, such as air, that passes through the apertures 410 must also pass through the mesh 408. The mesh can include apertures or perforations of substantially any size, shape, or distribution.

Figure 8:
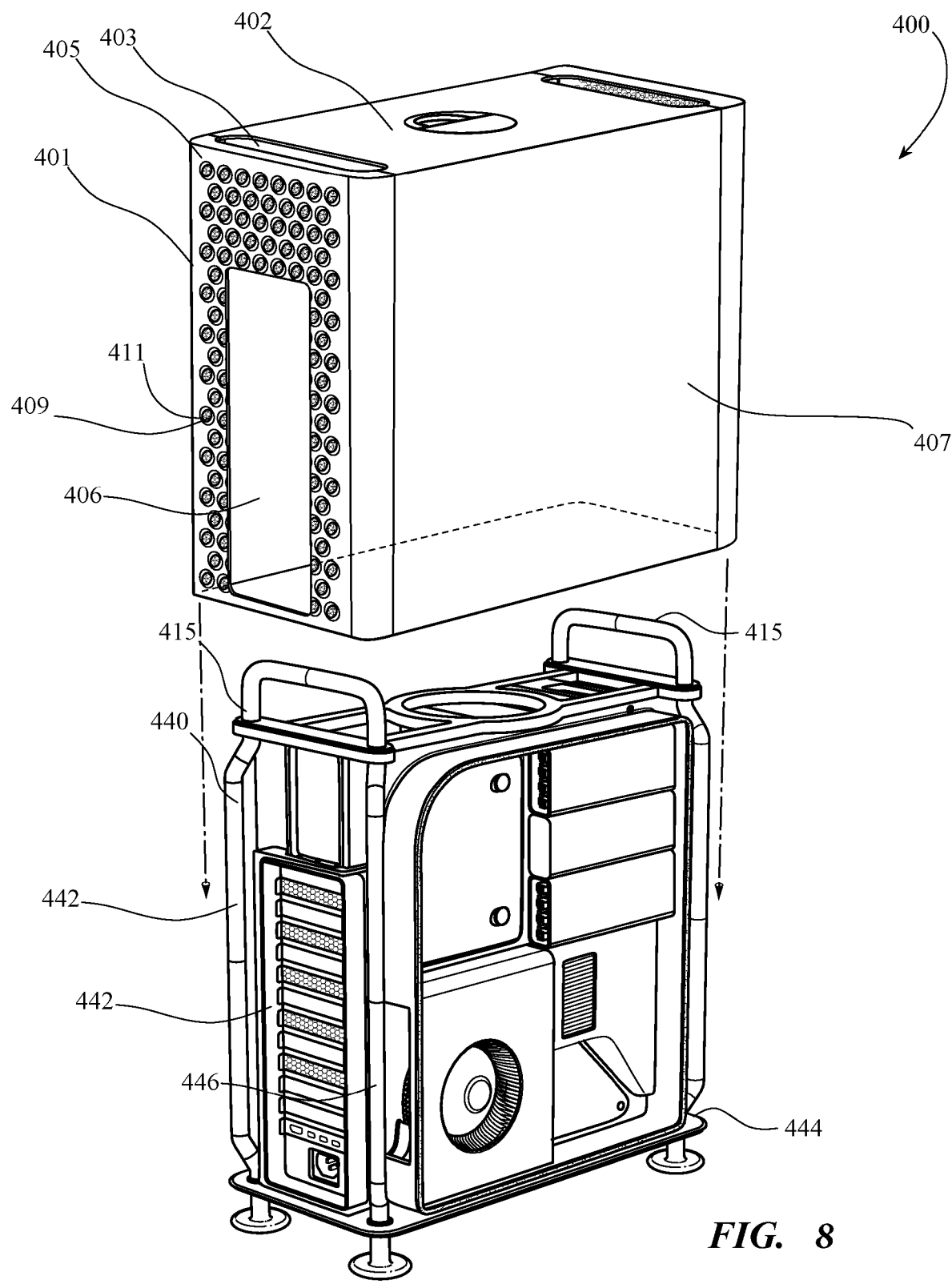
FIG. 8 illustrates a rear perspective view of components of the electronic device of FIG. 7.

FIG. 8 illustrates a rear perspective view of the electronic device 400 including the shell 401 separated from the frame 440. As illustrated, the frame 440 can include a port or interface panel 442 that can include one or more ports and that can be substantially similar to interface panel 220. The frame 440 can also include a floor panel or a bottom panel 444 that can at least partially define the internal volume of the device, as well as the external surface of the device. When the shell 401 is positioned over the frame 440, it can engage with the bottom panel 444, for example at the periphery, to at least partially define the exterior surface and the internal volume of the device. The interface panel 442 can be coupled to and be disposed substantially normal to the bottom panel 444, and can further define the exterior surface and the internal volume of the device.

The shell 401 can include a second panel or a rear panel 405 that can be substantially an entire height of the electronic device 400. In some examples, the rear panel 404 can define a number of apertures, holes, perforations, or passageways 410 that extend therethrough and that can provide fluid communication between the ambient environment and the internal volume defined by the shell 401. In some examples, the apertures 410 can be substantially similar to apertures 210 described herein. The rear panel 405 can further define an engagement or mating slot 406 that can be sized to receive and engage with or mate with a periphery of the interface panel 442. Accordingly, the shell 401, the interface panel 442, and the bottom panel 444 of the frame 440 can cooperate to define the exterior surface and an internal volume of the electronic device.

In some examples, the shell 401 can further include a mesh or perforated component 408 that can be coupled to or can be disposed substantially adjacent to the surface of the rear panel 405 that at least partially defines the internal volume. In some examples, the mesh can substantially cover the apertures 410 such that any fluid, such as air, that passes through the apertures 410 must also pass through the mesh 408. The mesh can include apertures or perforations of substantially any size, shape, or distribution. In some examples, the front panel 404 and the rear panel 405 of the shell can be coupled to or otherwise connected to the side panels 407 and the top panel 402 to form the integrally removable shell 401.

Figure 9:
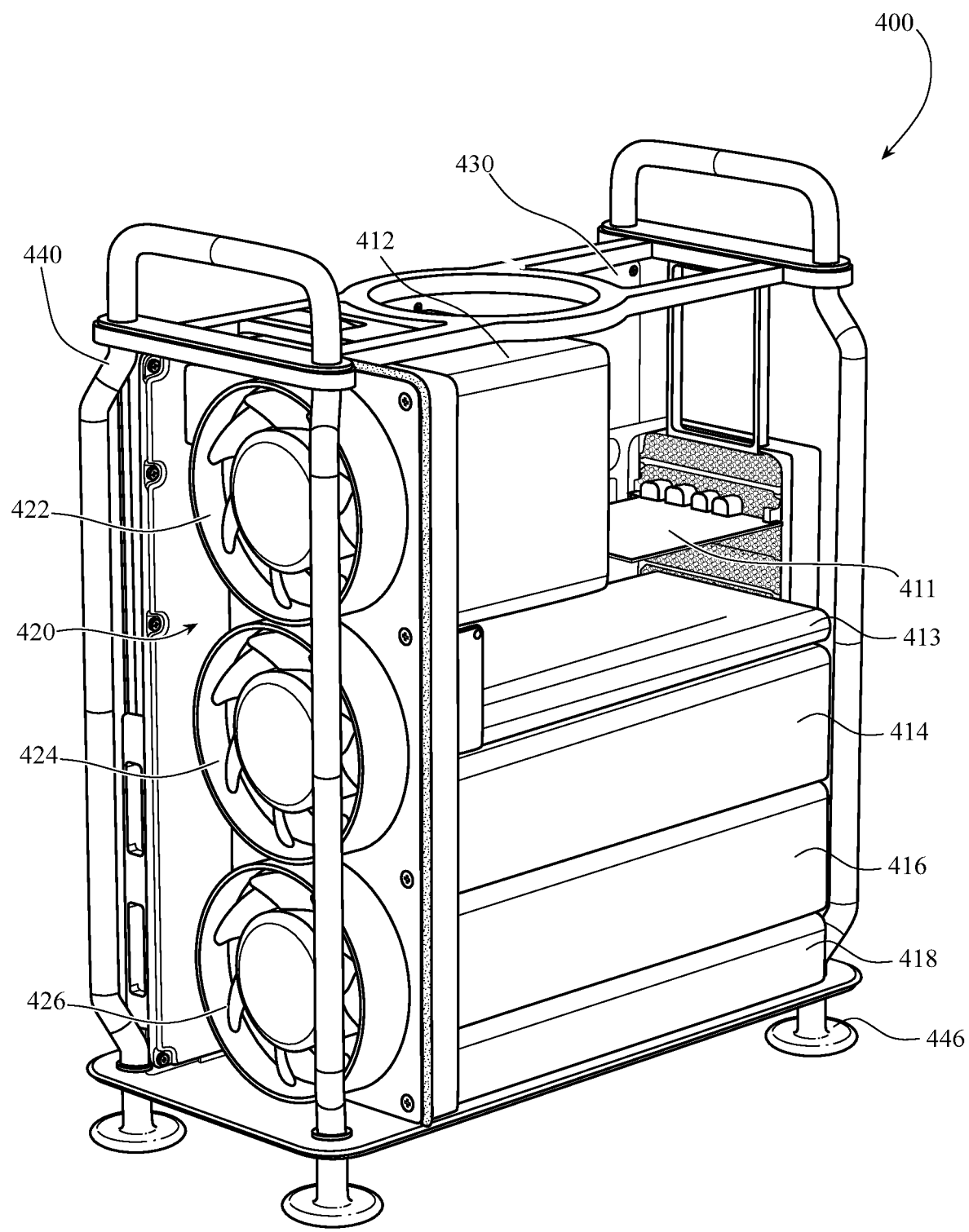
FIG. 9 illustrates a perspective view of the interior of the electronic device of FIG. 7.

FIG. 9 illustrates a perspective view of the interior of an electronic device 400. The electronic device 400 is merely one representative example of a device that can be used in conjunction with the systems and concepts disclosed herein.

In the present example, the shell of the housing, which can be similar to housing 201 described herein, is not shown. As can be seen, the frame 440 can include one or more support members 446 that extend from the bottom panel 444 and that can be substantially normal thereto. In some examples, the support members 446 can be tubular support members and can be substantially hollow. In some examples, the frame 440 can include four tubular support members 446, each tubular support member 446 can be disposed approximately adjacent or near to a corner of the bottom panel 444. In some examples, one or more tubular support members 446 can be connected or joined together by another component, such as the handles 409. Thus, in some examples, a handle 409 can include a first end connected to a first tubular support member 446 and a second end connected to a second tubular support member 446.

The electronic device 400 can include a frame or chassis 440 that can connect to and at least partially support the housing when it is secured to the electronic device 400. The chassis 440 can also define a lower or bottom exterior surface of the device 400. Together, the shell 401 and the chassis 440 can be considered the housing and can substantially define the exterior surface of the device 400. The chassis 440 can further provide structural support to the electronic device 400. The components of the electronic device 400 can be affixed to the housing and/or the chassis 440 via internal surfaces, attachment features, threaded connectors, studs, posts, and other fastening systems, that are formed into, extending into the body from, or otherwise part of the housing and/or the chassis 440.

In the present example, the main logic board 430 can divide and separate the internal volume into a plurality of zones, such as a first zone and a second zone. FIG. 9 provides a view of the first zone of the internal volume of the electronic device 400. In this example, the main logic board 430 is sized and positioned within the internal volume defined by housing such that the main logic board 430 extends substantially an entire height and width of the internal volume, thereby dividing the internal volume into a first zone located on one side of the main logic board 430, and a second zone located on the other, opposite side of the main logic board 430, for example, as described with respect to FIGS. 4-6.

A number of electronic, electrical, and other components of the electronic device 400 can be disposed within the first zone and can be connected to a first surface or side of the main logic board 430. In this example, a CPU 412, one or more graphics processing units (GPUs) such as GPUs 414 and 416, a power supply unit 418, and a first air-moving apparatus 420, are connected to the first side of the main logic board 430. In some examples, one or more of the components can be directly connected to the main logic board 430, for example, by soldering or by interfacing with one or more ports, such as PCIe ports on the main logic board 430. The electronic device 400 can include additional electronic components that are connected to the main logic board 430, for example, by ports disposed on the main logic board 430. In some examples, the ports can include one or more ports to connect components such as expansion cards to the electronic device 400 through an expansion bus. Accordingly, in some examples, the main logic board 430 can include one or more computer expansion bus interconnects, for example serial computer expansion bus interconnects such as PCIe slots. The interconnects can allow a user to add additional components, such as components 411 and 413 to the electronic device 400, to allow for additional functionality, as desired.

Further, the configuration of the components within both the internal volume and the first zone, as well as the location of the expansion slots on the main logic board 430, allow for a high level of access to the components when the housing is removed from the electronic device 400, as shown. Thus, a user or a technician can easily add, remove, or replace the components of the electronic device 400 when the housing has been removed.

As described with respect to electronic device 300, the electronic device 400 can include a first air-moving apparatus 420 that can include one or more air-moving components, such as fans. In the present example, the air-moving system 420 can move air from the ambient environment into the first zone through, for example, holes in the housing, to create a positive air pressure in the first zone relative to the ambient environment. The first air-moving apparatus 420 can include a first fan 422, a second fan 424, and a third fan 426. The fans 422, 424, 426 can be affixed together to a component that is secured to, for example, the chassis 440. The first air-moving apparatus 420 can, according to one example, extend substantially an entire height of the electronic device 400, effectively moving a wall of air into the first zone and past the components located therein. In some examples, the speed of each fan 422, 424, 426 can be independently controlled, such as by a processor of the electronic device 400, to create a desired location and amount of airflow into the first volume. In some examples, a fan blade diameter of the fans 422, 424, 426 can be about 140 mm.

The arrangement of the first air-moving apparatus 420 with respect to the components and expansion slots in the first zone allows for the addition or removal of various components from the electronic device 400 without substantially impacting the airflow pathways through the electronic device 400. Whereas the addition of components to a traditionally configured computer can result in airflow blockages and dead spots, the use of zones and a first air-moving apparatus 420 that extends substantially the entire height of the first zone allows for airflow to be provided to the components without regard to whether additional components have been added or removed, thereby achieving a desired level of airflow and heat removal that is compatible with a highly modular and customizable design. Additional details of the interior of the electronic device 400 are provided below with reference to FIG. 10.

Figure 10:
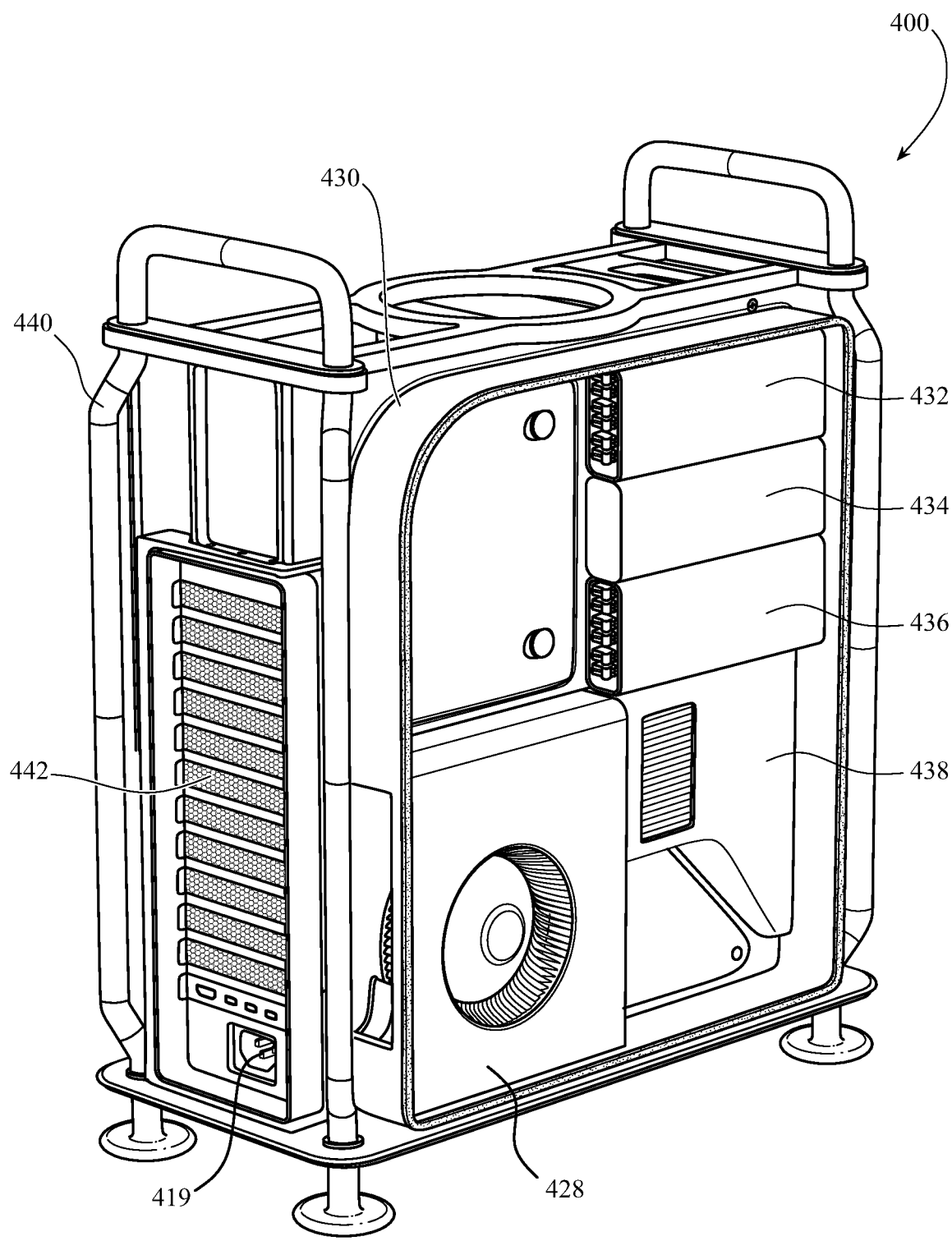
FIG. 10 illustrates a perspective view of the interior of the electronic device of FIG. 7.

FIG. 10 illustrates a perspective view of the interior of an electronic device 400. Whereas FIG. 9 depicts the right side of the electronic device 400 including the first zone, FIG. 10 shows the left side of the electronic device 400 including the second zone. As described with respect to FIG. 4-6, a component, such as the main logic board 430, can divide the internal volume into a plurality of zones. While the components described above with respect to FIG. 9 are connected to one side or surface of the main logic board 430, the electronic device 400 can include components disposed in the second zone and connected to a second, different side of the main logic board 430. In some examples, the electronic device 400 can include one or more memory modules 432, 434, 436, such as, dual inline memory modules (DIMMs). The memory modules 432, 434, 436 can be positioned and electrically connected to the main logic board 430. The electronic device 400 can also include storage, for example in the form of a drive such as solid-state drive (SSD) 438. The SSD 438 can be disposed in the second zone and can also be positioned on the main logic board 430. The SSD can be electrically connected to one or more other components of the electronic device 400.

The air-moving system of the electronic device 400 can further include a second air-moving apparatus 428 positioned within the second zone. In the present example, the second air-moving apparatus 428 can include a blower 428 to move air from the second zone to the ambient environment through the housing, for example through holes formed in the housing. In this way, the second air-moving apparatus 428 can produce a negative air pressure in the second zone relative to the ambient environment. Creation of the negative air pressure in the second zone causes a flow of air across the components in the second zone. Although the second air-moving apparatus 428 is described as a blower, in some examples, any suitable component capable of moving air or producing airflow can be included in the first air-moving apparatus 420. As used herein, the term blower can refer to a centrifugal fan that can include, for example, an impeller and a ducted housing to direct air moved by the impeller.

The electronic device 400 can include an interface panel 442 that can be substantially similar to the interface panel 220 described with respect to FIG. 3. The interface panel 442 can also include various ports that can be used to communicate data and/or power between the electronic device 400 and various external systems. For example, the interface panel 442 can include an alternating current (AC) power input port 419, which can be sized and shaped to accept a power plug suitable for transferring external power to the power supply unit 418 of the electronic device 400. The interface panel 442 can also include one or more holes, apertures, or perforations that allow air to be moved through the interface panel 442. For example, the interface panel can be located at an edge of a zone, such as the first zone, and air can be moved from the first zone to the ambient environment through the interface panel 442. Further details of the zones and the modular nature of the electronic device 400 are provided below with reference to FIG. 11.

Figure 11:
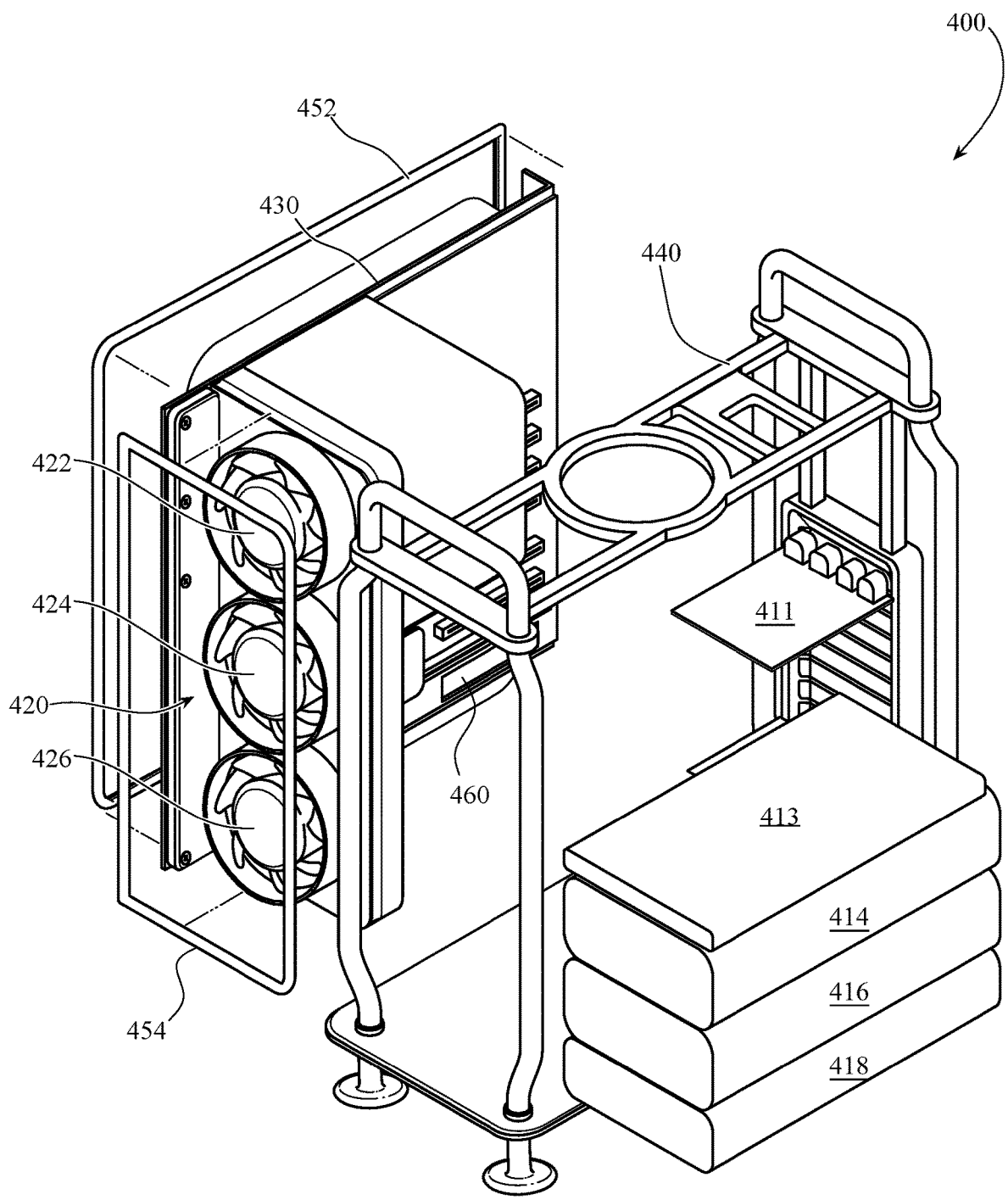
FIG. 11 illustrates an exploded top perspective view of an electronic device.

FIG. 11 shows an exploded view of the electronic device 400 including the chassis 440, the components disposed with in the internal volume, and the air-moving system. As described herein, a component, in this example the main logic board 430 disposed within the internal volume, can serve to divide the internal volume into a plurality of zones. In the present example, the main logic board 430 spans two major dimensions of the internal volume defined by the housing to thereby divide the internal volume into two zones. Further, the first zone and the second zone can be fluidically isolated from one another, except at one or more desired locations.

In some examples, the electronic device 400 can further include one or more seals that can prevent airflow at undesired locations, such as, for example, between zones defined by the main logic board 430. In use, when the housing is situated on the electronic device, the main logic board 430 and the housing together prevent airflow between zones by providing a physical barrier to airflow. Accordingly, it can be undesirable for unanticipated or unintentional gaps or spaces to exist where the housing and main logic board 430 meet because these gaps can allow undesired airflow and can inhibit the creation of a pressure differential between the zones, as described herein. In order to ensure that the zones are fluidically isolated from one another, except at desired locations, one or more sealing components can be used to create an air impermeable seal at desired locations between the housing and the main logic board 430. In the present example, a seal or sealing component 452 can at least partially surround the main logic board 430, and in some examples can substantially surround an entire perimeter of the main logic board 430. The seal 452 can include any compressible or compliant material as desired, such as, for example, a polymer material such as rubber that is capable of forming a substantially air impermeable seal between components of the electronic device 400. When the housing is situated on the electronic device 400, the alignment of the housing and a component, such as the main logic board 430, can cooperate with the seal 452 to form a substantially air impermeable barrier. For example, the housing and the main logic board 430 can exert pressure on the seal 452 to create a substantially air impermeable barrier.

In some examples, the electronic device 400 can include one or more additional sealing components, for example, at any location in the device 400 where airflow is not desired. In some examples, a seal 454 can at least partially surround one or more other components of the electronic device 400, such as the first air-moving apparatus 420. In the present example, the seal 454 substantially surrounds the first air-moving apparatus 420 and cooperates with the housing to prevent airflow from the first zone back to the ambient environment at this location. In some examples, where the first zone has a positive air pressure, a seal such as the seal 454 can help prevent or inhibit backflow, i.e., airflow from the first zone into the ambient environment at undesired locations.

In some examples, the zones can be fluidically isolated by a main logic board 430 that is substantially impermeable to airflow except at one or more desired locations. In this way, the main logic board 430 serves to selectively inhibit the movement of air between the first zone and the second except at the desired locations. Thus, in some examples, the component such as main logic board 430 can include or be constructed from a material that is substantially impermeable to airflow. In order to control the airflow between zones, the main logic board 430 can include an aperture or through-hole 460 that can serve to fluidically connect the first zone and the second zone, and can allow air to predictably flow between the zones through the aperture 460. As described further herein, in some examples one zone can have a positive air pressure while another zone can have a negative air pressure. Accordingly, the relative pressure of each zone will drive air to flow from the positive air pressure zone to the negative air pressure zone, while the aperture 460 provides the path of least resistance for this flow to occur, thereby controlling the location of airflow between the zones.

FIG. 11 also shows the arrangement of the components, for example components 411, 413, 414, 416, and 418 in the first zone of the internal volume can maximize or increase the surface area of the components exposed to air being moved by the first air-moving apparatus 420. In some examples, one or more of these components can include a heatsink, for example, in the form of a highly thermally conductive material that can transfer heat between the operational parts of the component and the passing air. The orientation of these components with respect to the airflow driven by, for example, the first air-moving apparatus 420, as enabled by the dual-sided configuration of the main logic board 430, can allow for the maximization of heatsink surface area that is exposed to flowing air, as compared to traditional computer and electronic device architectures. Additional embodiments of the structure and arrangement of an electronic device including a housing defining an internal volume divided into one or more zones by a component or components within the internal volume are described below, with reference to FIGS. 12-13.

Figure 12:
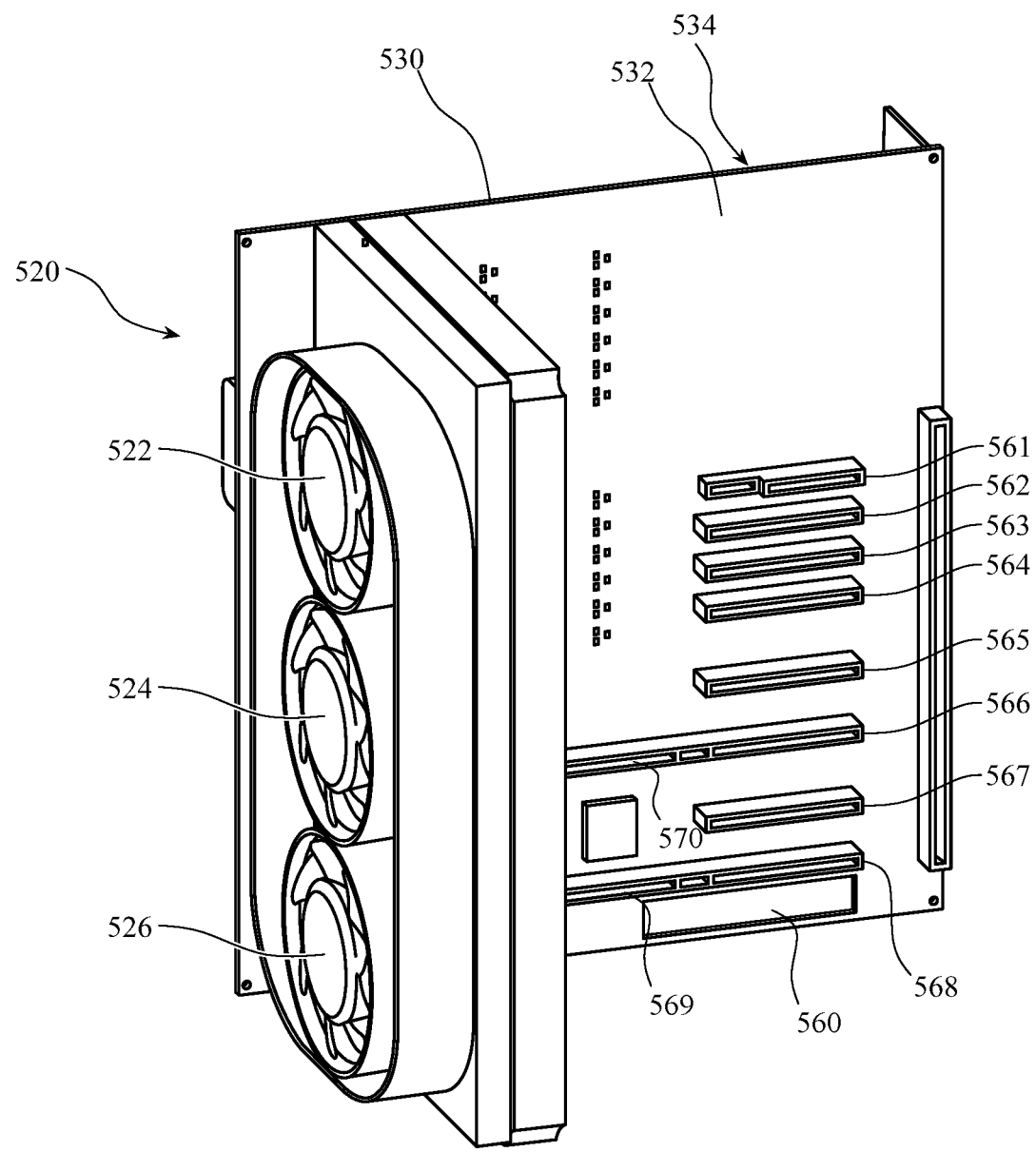
FIG. 12 illustrates a side perspective view of a component of an electronic device.

FIG. 12 shows a perspective view of a component of an electronic device, such as for example a main logic board 530. In some examples, the electronic device can be substantially similar to and include some or all of the features of the electronic devices 100, 200, 300, and 400 described herein. Further, the main logic board 530 can be substantially similar to and include some or all of the features of components 330 and 430 described herein.

In the present example, the main logic board 530 can be, for example, a printed circuit board including a polymeric substrate. In some examples, the main logic board 530 can include any substrate material as desired, for example, composite materials such as fiberglass material, polymer-based composite, metals, and combinations thereof. The main logic board 530 can include a first surface 532 and a second surface 534 disposed opposite the first surface 532. In some examples, however, the main logic board 530 can have substantially any shape and amount or orientation of surfaces, as desired.

As shown, in some examples, one or more components of the air-moving system of the electronic device can be affixed or otherwise connected to the first surface 532 of the main logic board 530. In some examples, the first air-moving apparatus 520, including a first fan 522, a second fan 524, and a third fan 526 can be connected to the main logic board 530. In this way, the main logic board 530 and the first air-moving apparatus 520 can cooperate to fluidically isolate the first zone from the second zone and the ambient environment. As described herein, other components of the electronic device can be directly connected to the first surface 532 of the main logic board 530, for example, by soldering or other methods of fixture. In some examples, the first surface 532 of the main logic board 530 can include one or more expansion slots. For example, the first surface 532 of the main logic board 530 can include one or more computer expansion bus interconnects. In some examples, a computer expansion interconnect can be serial or parallel computer expansion bus interconnects such as PCI or PCIe slots. The interconnects 561, 562, 563, 564, 565, 566, 567, 568, 569, and 570 can allow a user to add and connect additional components to the electronic device to allow for additional functionality, as desired. Although FIG. 12 shows one particular arrangement of the interconnects 561, 562, 563, 564, 565, 566, 567, 568, 569, and 570, it will be appreciated that they can be arranged in substantially any orientation on the first surface 532 of the main logic board 530. In some examples, the arrangement of the interconnects 561, 562, 563, 564, 565, 566, 567, 568, 569, and 570 can allow for the easy removal, addition, or replacement of one or more components, as described herein, providing modularity and configurability to the electronic device. In some examples, the main logic board 530 can thus include 10 interconnects, 11 interconnects, 12 interconnects, or even more.

The main logic board 530 can define an aperture or through-hole 560. The aperture 560 can serve to provide a fluid communication path between pressure zones on either side of the main logic board 530, as described herein. In some examples, the aperture 560 can have a substantially rectangular shape, as depicted. In some examples, the aperture 560 can have any shape or size as desired and as determined by, for example, a desired level of airflow through the aperture 560. In some examples, the main logic board 530 can define multiple apertures as desired. In some examples, multiple apertures can be located at the approximate location of the aperture 560 or can be positioned at any location on the main logic board 530, as desired to provide a desired level or airflow there through. Additional details of the main logic board 530 are provided below with reference to FIG. 13.

Figure 13:
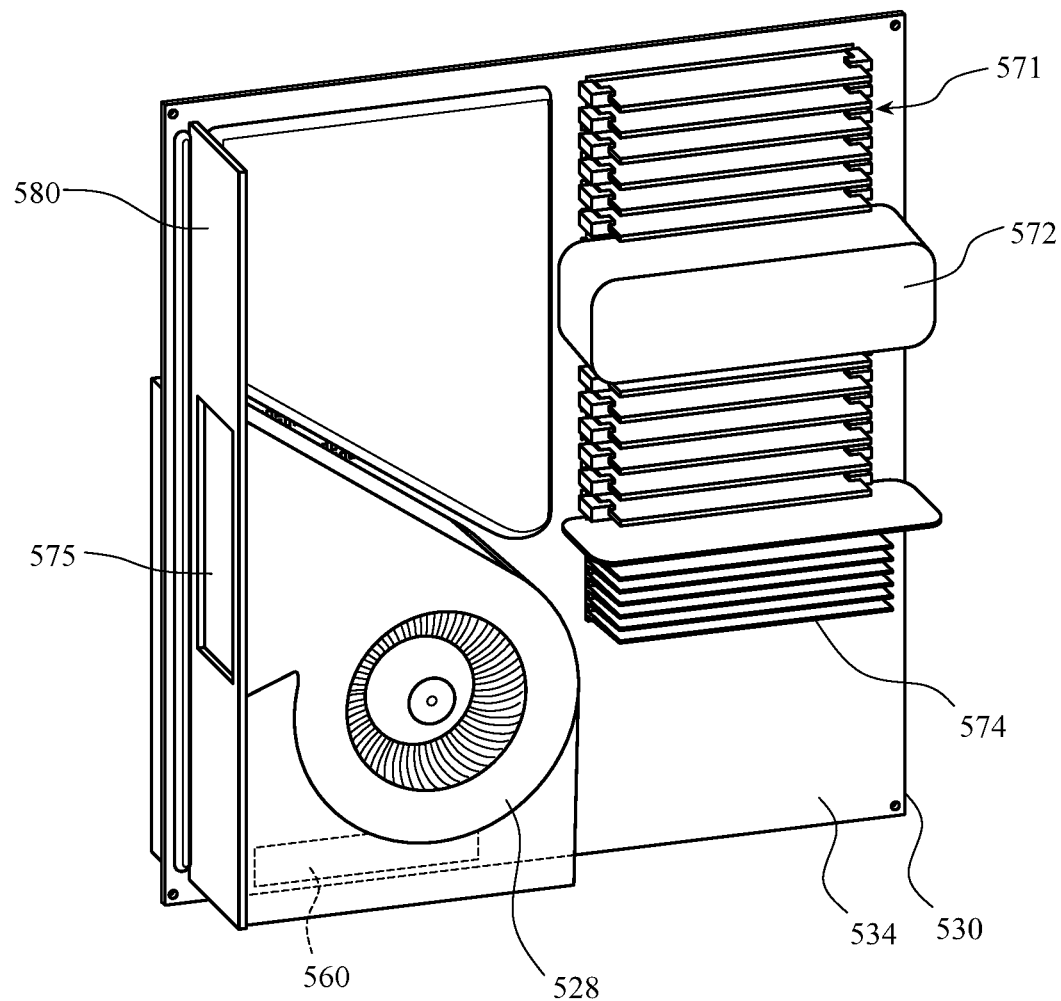
FIG. 13 illustrates a side perspective view of the component of FIG. 12.

FIG. 13 illustrates another perspective view of the main logic board 530, showing the second surface 534 disposed substantially opposite the first surface 532. As discussed herein, the main logic board 530 can include electronic components disposed on two opposite sides, thereby allowing for components of the electronic device to be positioned in different pressure zones, to allow for optimal cooling and thermal management, while still providing ease of access to a user or technician. Whereas components such as CPU and GPU can be connected to the first surface 532 of the main logic board 530, other components, such as memory components can be positioned on the second surface 534.

In some examples, the main logic board 530 can include a number of slots 571 or connections that can receive modules, such as memory modules, which can be connected to the electronic device. In some examples, one or more memory modules 572, such as dual inline memory modules (DIMMs) can be connected to the main logic board 530. The main logic board 530 can also include components such as a heatsink 574 disposed on the second surface 534. Again, the position of a component such as a heatsink 574 on the second surface 534 allows air to flow past the heatsink 574 to provide cooling and thermal management, without interrupting or impeding airflow to other components, for example those positioned on the first surface 532. As discussed, the air-moving system of the electronic device can include a second air-moving apparatus, for example blower 528. In some examples, the blower 528 can be connected to or affixed to the main logic board 530, for example via any manner of attachment features in the blower housing and/or main logic board 530. In some examples, the blower 528 can be positioned at least partially over or can cover or occlude all or some of the aperture 560 of the main logic board 530. In this way, the blower 528 can move air from the first zone into the second zone and out of the electronic device. That is, the blower 528 can pull or suck in air from the first zone through the aperture 560 as described herein to create airflow between the zones and to provide a negative air pressure in the second zone. The second air-moving apparatus can also include a panel 580 that can serve to further seal or isolate the second zone when in use, for example by preventing air from flowing into the second zone from the ambient environment at the location of the panel 580. The panel 580 can also include a cut-out, through hole, or aperture 575 that can align with the exhaust of the blower 528 to allow the blower to expel air from the second zone into the ambient environment. Exemplary embodiments of components that can be incorporated in the electronic devices detailed above are described below, with reference to FIGS. 14-16.

Figure 14:
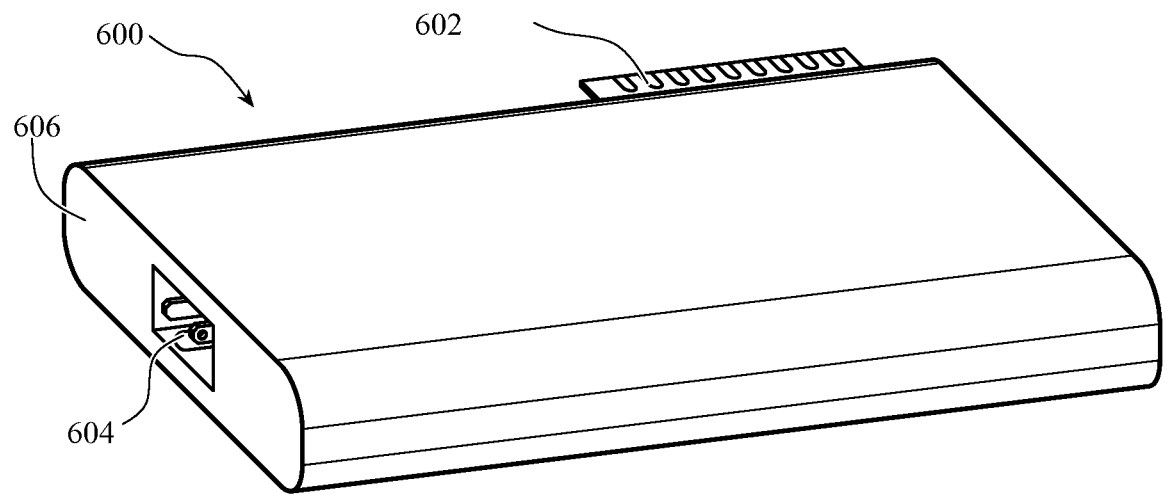
FIG. 14 illustrates a perspective view of a component of an electronic device.

FIG. 14 illustrates a perspective view of a component of an electronic device, in this example, a power supply unit 600. The power supply unit 600 can be a component of any of the electronic devices described herein, including electronic devices 100, 200, 300, and 400. The power supply unit 600 can also be substantially similar to and include any of the features of the power supply units 318 and 418 described herein.

As will be explained further herein, in some examples it can be desirable to cause air to flow directly at or through a particularly high-power component of an electronic device. In some examples, such a component can be positioned directly in an airflow pathway in the internal volume of the electronic device, for example at a location of communication between a positive air pressure zone and a negative air pressure zone. In this way, a relatively large volume of air can be moved over or through the component in order to provide a desired level of thermal energy removal and thermal management for the component, such as the power supply unit 600, and the electronic device as a whole.

In some examples, as described herein, the power supply unit 600 can be positioned in an airflow pathway because it is typically the densest component of the electronic device and prevents the largest obstruction to airflow. As such, it can be desirable to position the power supply unit 600 in a high-volume airflow pathway. Further, in some examples, the power supply unit 600 can be responsible for up to about 10% of the power, and thus generated thermal energy, for the components within the internal volume of the electronic device. Accordingly, in some examples, it can be desirable to provide high levels of air flow, and thus cooling, to the power supply unit 600.

The power supply unit 600 can include a housing or body 606 that can define an exterior surface of the power supply unit 600. The power supply unit 600 can also include a connector 602 that can, for example, connect to an expansion slot or other interface on a main logic board, as described herein. Such a connection can allow for the electronic device to control the power supply unit 600 and the power distributed from the power supply unit 600. An alternating current (AC) power input port 604 of the power supply unit 600 can be used to connect to an external source of AC power which the power supply unit can transform into DC power for use by the components of the electronic device. Further details of the power supply unit 600 are provided below with reference to FIGS. 15 and 16.

Figure 15:
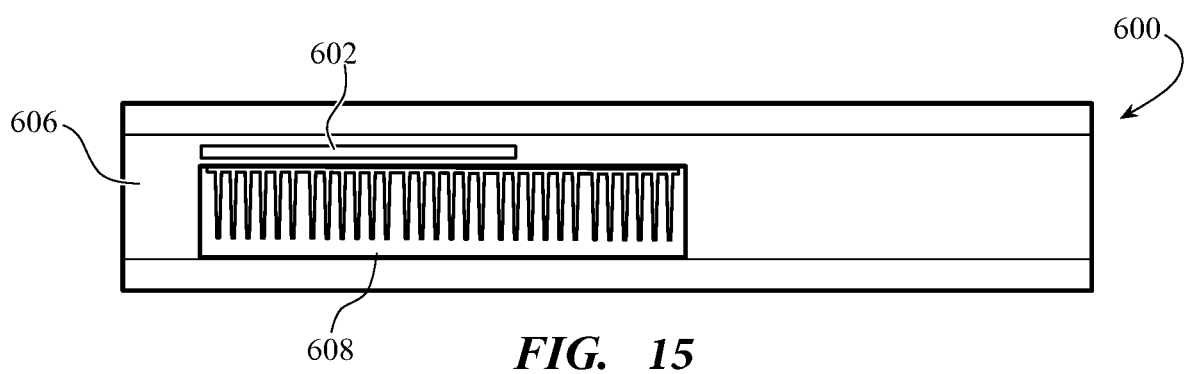
FIG. 15 illustrates a side view of the component of FIG. 14.

FIG. 15 illustrates a side view of the power supply unit 600, including a heatsink 608. The heatsink 608 can be thermally connected to the power supply unit to assist in distributing thermal energy generated by the power supply unit 600 to the air flowing past the power supply unit 600. In some examples, the heatsink 608 can include any highly thermally conductive material, such as metallic materials like copper, aluminum, and other metals or alloys. In use, as air moved by the air-moving system of the electronic device moves past the heatsink 608, thermal energy is transferred to the air which is then expelled from the electronic device into the ambient environment, thereby cooling the power supply unit 600 and the device.

Figure 16:
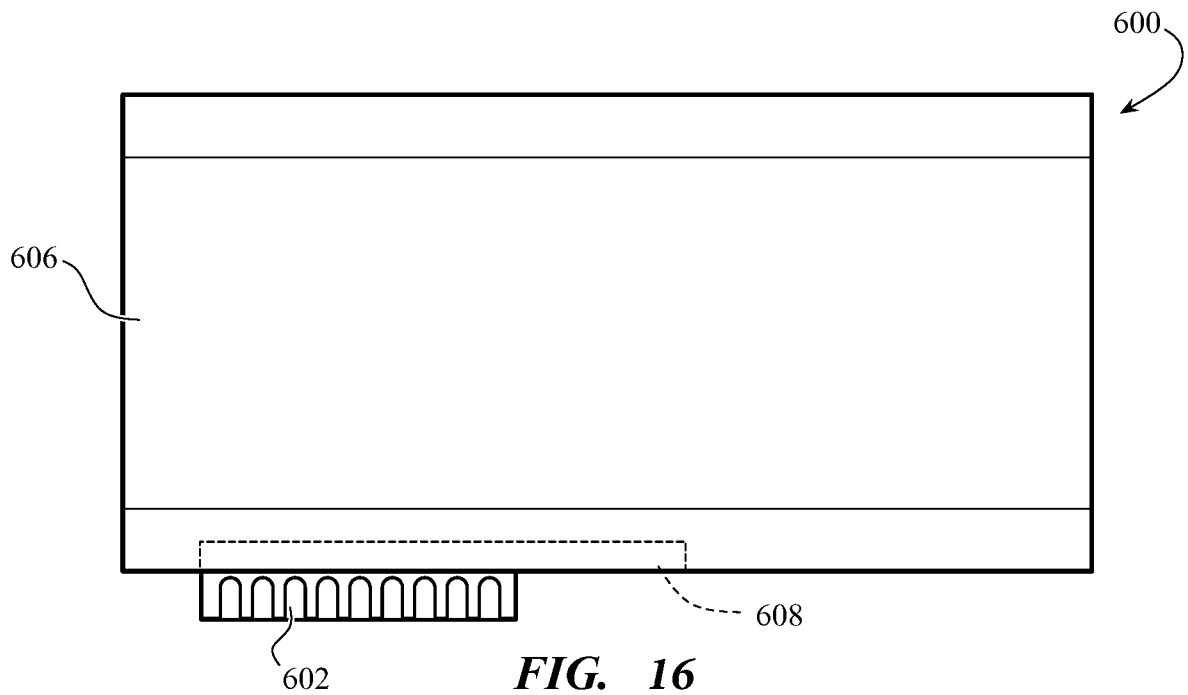
FIG. 16 illustrates a top view of the component of FIG. 14.

FIG. 16 illustrates a top view of the power supply unit 600. As can be seen, in some examples the heatsink 608 can be recessed in the body 606 of the power supply unit 600. This recess can provide for a pathway for air to flow to the heatsink 608 and past the power supply unit 600, thereby assisting in thermal management. In some examples, the recess can be aligned with an aperture in the main logic board of an electronic device to provide an airflow pathway between pressure zones of the device.

As noted above, any number or variety of components, as described herein, can be included in an electronic device. The components can include any combination of the features described herein and can be arranged in any of the configurations described herein. The structure and arrangement of an electronic device including a housing defining an internal volume divided into one or more zones by a component or components within the internal volume, as well as the concepts regarding zone pressures and airflow can apply not only to the specific examples discussed herein, but to any number of embodiments in any combination. Various embodiments of electronic devices including components having various features in various arrangements are described below, with reference to FIGS. 17-19.

Figure 17:
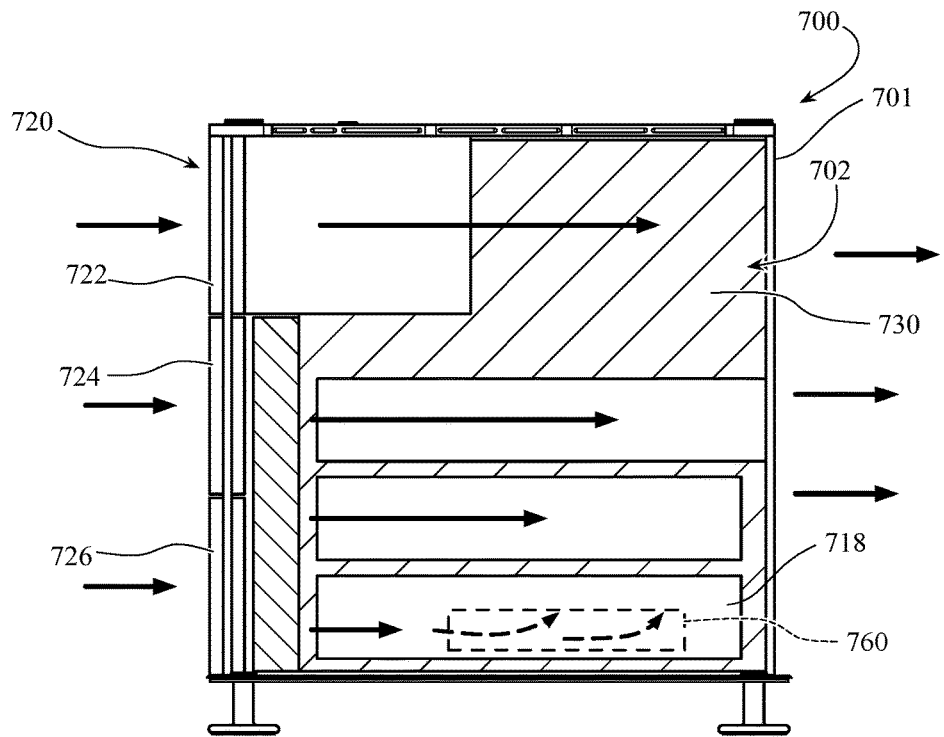
FIG. 17 illustrates a schematic cross-sectional view of an electronic device including arrows illustrating airflow.
Figure 18:
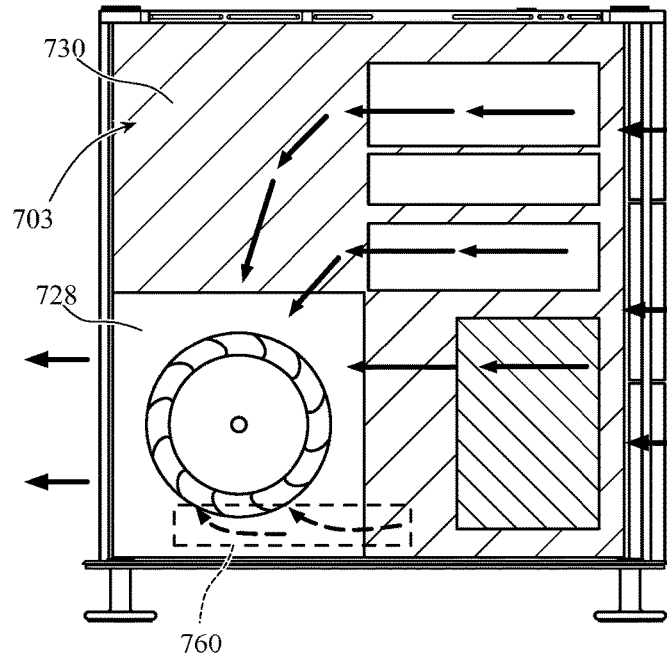
FIG. 18 illustrates a schematic cross-sectional view of the electronic device of FIG. 17 including arrows illustrating airflow.
Figure 19:
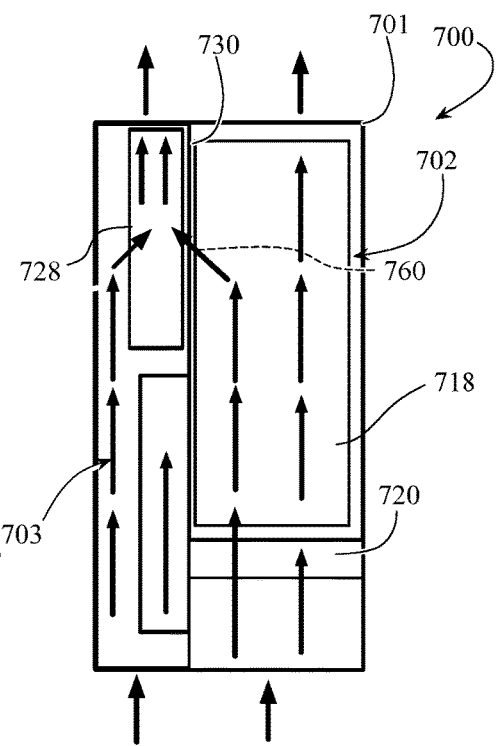
FIG. 19 illustrates a schematic top view of the electronic device of FIG. 17 including arrows illustrating airflow.

FIG. 17 illustrates a schematic cross-sectional view of an electronic device 700, similar to the electronic device 300 illustrates in FIG. 4. As with the electronic device 300, the electronic device 700 can include a housing 701 that is similar to the housing 201 described herein, as well as a component 730 that can divide the internal volume defined by the housing 701 into a first volume or zone (702, shown) and a second volume or zone 703, as shown in FIGS. 18 and 19. The component 730 can define an aperture 760 that provides fluid communication between the zones. In some examples, a component 718 can be positioned to at least partially cover or obscure the aperture 760 such that air is forced through or around the component 718 to pass through the aperture 760. The electronic device 700 can further include a first air-moving apparatus 720 including a first fan 722, second fan 724, and third fan 726 that are substantially similar to the first air-moving apparatus 320.

FIG. 17 includes dark arrows that illustrate the direction of airflow into and within the electronic device 700. In this example, the first air-moving apparatus 720 pushes air from the ambient environment into the first zone 702 through the housing 701. The air from the ambient environment can pass through various apertures or holes in a surface of the housing, as described herein. The pushed air can then flow through the first zone 702, where it can pass over and become heated by the components in the first zone 702. The first air-moving apparatus 720 pushing air into the first zone can cause the first zone to have a positive air pressure relative to the ambient environment.

In some examples, some of the air within the first zone 702 can then continue to flow through the first zone where it can exit back into the ambient environment, for example, through apertures or holes in the housing positioned opposite the first air-moving apparatus 720, as described herein. As the air is heated by the components within the first zone 702, removal of the air from the internal volume of the electronic device 700 also results in the removal of thermal energy, thereby cooling the electronic device 700. In some examples, some of the air in the first zone 702 can pass through the aperture 760 defined by the component 730 and into the second zone 703. This airflow is depicted with dashed arrows in FIGS. 17 and 18.

FIG. 18 illustrates a schematic cross-sectional view of an electronic device 700, similar to the electronic device 300 illustrates in FIG. 5. FIG. 18 includes dark arrows that illustrate the direction of airflow into and within the electronic device 700. In this example, the second air-moving apparatus 728 pulls air from the first zone 702 and the ambient environment into the second zone 703 and then out to the ambient environment through the housing 701, for example, through holes or apertures as described herein. The second air-moving apparatus 728 can create a negative air pressure in the second zone 703 relative to the ambient environment, thereby pulling air into the second zone 703 through the housing 701 where it can pass over and become heated by the components in the second zone 703 before exiting the second zone 703 through the housing. The second air-moving apparatus 728 can also move air from the first zone 702 to the ambient environment through the aperture 760 which can be at least partially aligned with an inlet of the second air-moving apparatus 728. Additional details of the airflow within the electronic device 700 are provided below, with reference to FIG. 19.

FIG. 19 shows a schematic top view of the electronic device 700, including the housing 701 that defines an internal volume thereof and the component 730 that divides the internal volume into a first zone 702 and a second zone 703 as described herein. Again, the electronic device 700 can be substantially similar to the electronic device 300 illustrated in FIG. 6. The bold and dashed arrows illustrated in FIG. 19 depict airflow into, out of, and through the electronic device 700, as described herein, for example, with respect to FIGS. 17 and 18. Namely, as illustrated, the first air-moving apparatus 720 and the second air-moving apparatus 728 cooperate to provide airflow through the zones of the device 700 and to produce a positive air pressure in the first zone 702 and a negative air pressure in the second zone 703. The first zone 702 and the second zone 703 are substantially fluidically isolated from one another by the component 730, except at the desired location of the aperture 760 where air can flow from the positive pressured first zone 702 into the negative pressured second zone 703, to assist with thermal management of the electronic device 700. Additional examples of electronic devices including components having various features in various arrangements are described below, with reference to FIGS. 20-22B.

Figure 20:
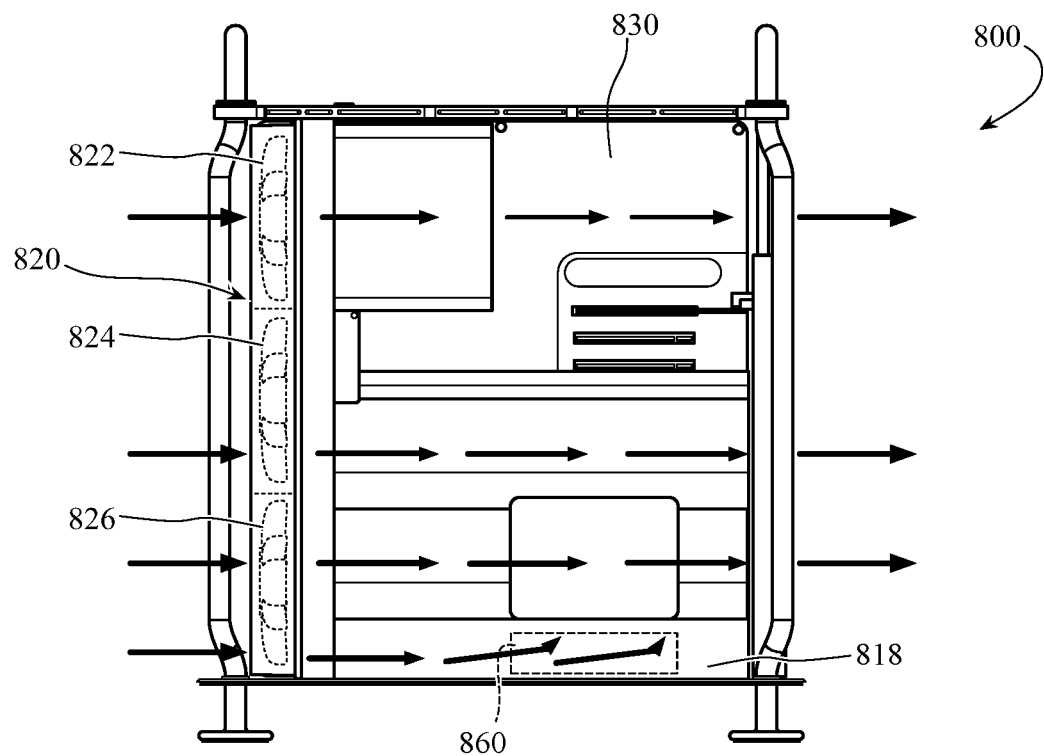
FIG. 20 illustrates a side view of the interior of an electronic device including arrows illustrating airflow.

FIG. 20 illustrates a schematic cross-sectional view of an electronic device 800, according to one example. The electronic device 800 can be substantially similar to, and can include any combination of the features and components of, the electronic device 400 described with respect to FIGS. 7-11. As with electronic device 400, the electronic device 800 can include a housing (not shown) that can substantially surround and enclose the components of the electronic device 800 and can define an internal volume in which the components reside. The electronic device 800 can include a main logic board 830 that can divide and separate the internal volume into one or more zones, such as a first zone and a second zone. FIG. 20 provides a view of the first zone of the internal volume of the electronic device 800. In this example, the main logic board 830 is sized and positioned within the internal volume defined by the housing such that the main logic board 830 extends substantially an entire height and width of the internal volume, thereby dividing the internal volume into a first zone located on one side of the main logic board 830, and a second zone located on the other, opposite side of the main logic board 830, for example, as described with respect to FIGS. 4-6 and 7-11. The main logic board 830 can define an aperture 860 that provides fluid communication between the zones. In some examples, a component, such as a power supply unit 818, can be positioned to at least partially cover or obscure the aperture 860 such that air is forced through or around the power supply unit 818 to pass through the aperture 860.

As described with respect to electronic device 400, the electronic device 800 can include a first air-moving apparatus 820, which can include one or more air-moving components, such as fans. In the present example, the air-moving system 820 can move air from the ambient environment, through some or all of the air-moving system 820, and into the first zone through, for example, holes in the housing to create a positive air pressure in the first zone relative to the ambient environment. The first air-moving apparatus 820 can include a first fan 822, a second fan 824, and a third fan 826. The fans 822, 824, 826 can be affixed together and secured to the electronic device 800. The first air-moving apparatus 820 can extend substantially an entire height of the electronic device 800, for example, as shown, effectively moving a wall of air into the first zone. In some examples, the first air-moving apparatus 820 can move air past and/or through some or all of the components located in the first zone as illustrated with arrows in FIG. 20. In some examples, the speed of each fan 822, 824, 826 can be independently controlled, for example, by a processor of the electronic device 800 to create a desired location and amount of airflow into the first volume. In some examples, some of the air in the first zone can pass through the aperture 860 defined by the power supply unit 818 and into the second zone, for example into an inlet of a blower that is disposed in the second zone as described herein. Details regarding the airflow in the second zone are provided below, with reference to FIG. 21.

Figure 21:
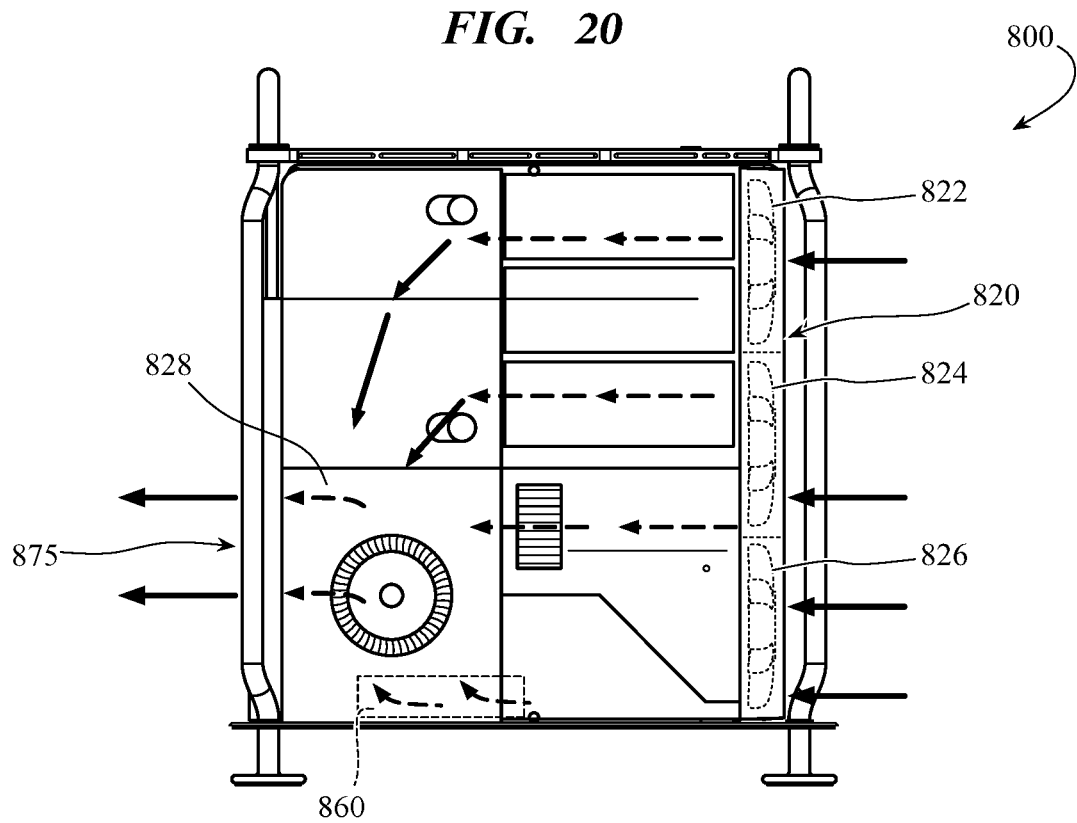
FIG. 21 illustrates a side view of the interior of the electronic device of FIG. 20 including arrows illustrating airflow.

FIG. 21 illustrates a schematic cross-sectional view of an electronic device 800, similar to the electronic device 400 illustrated in FIGS. 7-11, and including arrows depicting airflow. In this example, a second air-moving apparatus, for example a blower 828 pulls air from the first zone and the ambient environment into and through the second zone. In some examples, the blower 828 can also push air from the second zone out to the ambient environment through the housing, for example, through holes or apertures, as described herein. The blower 828 can create a negative air pressure in the second zone relative to the ambient environment, thereby pulling air into the second zone through the housing, where it can pass over and become heated by the components in the second zone, before exiting the second zone through the housing, for example through a vent our outlet 875 of the blower 828. The blower 828 can also move air from the first zone to the ambient environment through the aperture 860, which can be at least partially aligned with an inlet of the blower 828. Details regarding the combined airflow patterns within the electronic device 800 are provided below, with reference to FIGS. 22A and 22B.

FIGS. 22A and 22B show a schematic top view of the electronic device 800, including the housing 801 that defines an internal volume thereof, and the main logic board 830 that divides the internal volume into a first zone 802 and a second zone 803, as described herein. Again, the electronic device 800 can be substantially similar to the electronic device 400 illustrated in FIGS. 7-11. The bold and dashed arrows illustrated in FIGS. 22A and 22B depict airflow into, out of, and through the electronic device 800, as described herein, for example, with respect to FIGS. 20 and 21. The fans of the first air-moving apparatus 820 and the blower 828 can cooperate to provide airflow through the zones of the device 800 and to produce a positive air pressure in the first zone 802 combined with a negative air pressure in the second zone 803. The first zone 802 and the second zone 803 are substantially fluidically isolated from one another by the main logic board 830, except at the desired location of the aperture 860, where air can flow from the positive pressured first zone 802, through the power supply unit 818, and into the negative pressured second zone 803 to assist with thermal management of the electronic device 800, such as thermal management of components such as the DIMMs 815.

As described above, one aspect of the present technology is the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

As used herein, the terms exterior, outer, interior, inner, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A housing for an electronic device, comprising:
   an enclosure at least partially defining an internal volume, the enclosure comprising
      a top panel, a bottom panel, a left panel, and a right panel;
      the left panel and the right panel at least partially defining an exterior surface of the electronic device and at least partially defining the internal volume;
   a tubular frame, the tubular frame comprising:
      a first pair of tubular support members extending from the bottom panel;
      a second pair of tubular support members extending from the bottom panel;
      a first tubular top frame member disposed outside the internal volume and connected to an end of each of the first pair of tubular support members through an opening defined by the top panel;
      a second tubular top frame member disposed outside the internal volume and connected to an end of each of the second pair of tubular support members through an opening defined by the top panel; and
   at least one of the left panel or the right panel configured to be removable from a portion of the enclosure and the tubular frame.

2. The housing of claim 1, the enclosure further comprising:
   a front panel at least partially defining the exterior surface, the front panel defining a first plurality of apertures extending through the front panel; and
   a rear panel disposed opposite the front panel and at least partially defining the exterior surface, the rear panel defining a second plurality of apertures extending through the rear panel.

3. The housing of claim 2, wherein the left panel and the right panel are disposed between the front panel and the rear panel to at least partially define the exterior surface.

4. The housing of claim 2, wherein at least one of the front panel or the rear panel comprises a three-dimensional structure including a plurality of spherical recesses that define the first plurality of apertures or the second plurality of apertures.

5. The housing of claim 1, wherein the tubular frame further comprises an interface panel at least partially defining an exterior surface of the electronic device, the interface panel includes at least one data port.

6. The housing of claim 1, wherein the first tubular top frame member comprises a handle.

7. The housing of claim 1, wherein the first tubular top frame member is integral with the first pair of tubular support members.

8. The housing of claim 1, wherein the first tubular top frame is a separate component from the first pair of tubular support members.

9. A housing assembly for an electronic device, comprising:
   a tubular frame configured to receive and support computing components;
   a floor panel affixed to the tubular frame and at least partially defining an exterior surface of the electronic device;
   a top panel affixed to the tubular frame, at least a portion of the tubular frame extending through an opening defined by the top panel;
   an interface panel affixed to the tubular frame and at least partially defining the exterior surface, the interface panel including a data port; and
   a left panel and a right panel at least partially defining the exterior surface and at least partially defining an internal volume and at least a portion of the tubular frame, the left panel and the right panel being removably attachable to the tubular frame.

10. The electronic device of claim 9, further comprising a front panel defining a plurality of interconnected through holes in communication with the internal volume.

11. The electronic device of claim 9, wherein the tubular frame comprises a tubular support member extending from the floor panel into the internal volume.

12. The electronic device of claim 11, wherein the tubular frame comprises at least four tubular support members, each tubular support member disposed near a corner of the floor panel.

13. The electronic device of claim 9, wherein the left panel and the right panel comprise aluminum.

14. The electronic device of claim 9, wherein the tubular frame comprises a foot configured to support the electronic device, the foot extending through an opening defined by the floor panel.

15. A housing assembly for an electronic device, comprising:
- a tubular frame;
- a front panel defining a first plurality of apertures extending through the front panel;
- a rear panel defining a second plurality of apertures extending through the rear panel;
- a left panel;
- a right panel;
- a bottom panel; and
- a top panel defining an opening, a portion of the tubular frame extending through the opening;
- the front, rear, left, right, top, and bottom panels defining an exterior surface of the electronic device and an internal volume, at least the left panel and the rear panel being removably coupled to the tubular frame.

16. The housing of claim 15, wherein the first plurality of apertures comprises an interconnected network of passageways in communication with the internal volume.

17. The housing of claim 15, wherein the rear panel comprises a first portion including one or more data ports and a second portion that is removably coupled to the housing assembly and the first portion.

18. The housing of claim 15, wherein the tubular frame is at least partially disposed in the internal volume and configured to receive and support a plurality of electronic components.

19. The housing of claim 18, wherein the portion of the tubular frame at least partially defines a handle.

20. The housing of claim 15, wherein the first plurality of apertures and the second plurality of apertures allow air to be moved from an ambient environment through the internal volume.

* * * * *